United States Patent [19]
Tsutsumi

[11] Patent Number: 6,124,622
[45] Date of Patent: *Sep. 26, 2000

[54] MIS TRANSISTOR WITH A THREE-LAYER DEVICE ISOLATION FILM SURROUNDING THE MIS TRANSISTOR

[75] Inventor: Toshiaki Tsutsumi, Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/563,726

[22] Filed: Nov. 28, 1995

[30] Foreign Application Priority Data

Apr. 25, 1995 [JP] Japan ................................ 7-101312

[51] Int. Cl.[7] ............................................... H01L 21/306
[52] U.S. Cl. .......................... 257/506; 257/288; 257/324; 257/325; 257/326; 257/327; 257/328; 257/329; 257/330; 257/637; 257/638; 257/635; 257/524; 257/525
[58] Field of Search ................................ 257/288, 409, 257/487, 488, 491, 374, 506, 508, 524, 525, 635, 725, 625, 637–649, 324–330

[56] References Cited

U.S. PATENT DOCUMENTS

| | | | |
|---|---|---|---|
| 4,272,308 | 6/1981 | Varshney | 437/69 |
| 4,566,940 | 1/1986 | Itsumi et al. | 156/648 |
| 4,713,356 | 12/1987 | Hiruta | 257/752 |
| 4,767,724 | 8/1988 | Kim et al. | 257/752 |
| 4,786,615 | 11/1988 | Liaw et al. | 637/89 |
| 4,980,738 | 12/1990 | Welch et al. | 257/752 |
| 4,983,226 | 1/1991 | Hunter et al. | 257/513 |
| 5,132,755 | 7/1992 | Ueno | 257/296 |
| 5,346,587 | 9/1994 | Doan et al. | |
| 5,378,652 | 1/1995 | Samata et al. | 257/637 |
| 5,380,671 | 1/1995 | Lur et al. | 257/752 |
| 5,393,681 | 2/1995 | Witek et al. | 437/89 |
| 5,506,440 | 4/1996 | Wei et al. | 257/506 |
| 5,602,051 | 2/1997 | Cronin et al. | 438/396 |

FOREIGN PATENT DOCUMENTS

| | | | |
|---|---|---|---|
| 2310943 | 12/1990 | Japan | 257/635 |
| 6-244198 | 9/1994 | Japan . | |

OTHER PUBLICATIONS

IBM Technical Disclosure Bulletin, vol. 11 No. 7. Dec. 1968 A.R. Baker, Jr. et al.

"Fully Planarized 0.5$\mu$m Technologies for 16M Dram," W. Wakamiya, T. Eimori, H. Ozaki, H. Itoh, K. Fujiwara, T. Shibano, H. Miyatake, A. Fujii, T. Tsutsumi, S. Satoh and T. Katoh, *IEDM 88* (1988), pp. 246–249.

*Primary Examiner*—Fetsum Abraham
*Attorney, Agent, or Firm*—McDermott, Will & Emery

[57] ABSTRACT

A device isolation film is formed on one major surface of a semiconductor substrate so as to surround a device formation region. The device isolation film consists of a first layer made of silicon dioxide, a second layer made of polycrystalline silicon, and a third layer made of silicon dioxide. In a transistor formed in the device formation region, PN junction ends of source and drain regions are in contact with the first layer, and a gate electrode and source and drain electrodes are formed within an opening of the device isolation film. The top surfaces of the gate electrode and the source and drain electrodes are substantially flush with the surface of the third layer of the device isolation film. A gate electrode wiring layer and a source/drain electrode wiring layer for one of the source and drain electrodes are formed on the surface of the third layer. A source/drain electrode wiring layer for the other of the source and drain electrodes is formed on an interlayer insulation film and connected to the source or drain electrode via a contact hole.

16 Claims, 22 Drawing Sheets

MIS TRANSISTOR WITH A THREE-LAYER DEVICE ISOLATION FILM SURROUNDING THE MIS TRANSISTOR

BACKGROUND OF THE INVENTION

1. Field of the Invention

This invention relates to a semiconductor device and a manufacturing method therefor, and more particularly to a device isolation film and a MIS transistor that is formed on a device formation region of one major surface of a semiconductor substrate surrounded by the device isolation film.

2. Description of the Related Art

FIGS. 65 and 66 show a MIS transistor (an N-type MOS transistor in this example) formed on a device isolation film formed by a well known LOCOS method and in a device formation region on one major surface of a semiconductor substrate surrounded by the device isolation film. In the drawings, reference numeral 101 designates a semiconductor substrate consisting of a silicon substrate having a first conductivity type (a P type conductivity in this example), and reference numeral 102 designates a device isolation film which is made of a silicon oxide film and is formed on the device isolation region of the semiconductor substrate so as to surround the device formation region. The device isolation film is formed by forming a silicon nitride film so as to cover the device formation region, and by selectively oxidizing a part of the device formation region uncovered with the silicon nitride film, i.e., only the device isolation region by exposing the device formation region to an oxidizing atmosphere.

Reference numerals 103 and 104 are a pair of source/drain regions, and they are formed in the device formation region of the semiconductor substrate 101 surrounded by the device isolation region 102 in such a way as to be separated from each other with a channel region 105 being sandwiched between them. The source/drain regions 103 and 104 are formed by impurity regions having a low impurity concentration 103a and 104a, and high impurity concentration regions 103b and 104b. Reference numeral 106 is a gate electrode formed on the channel region 105 with a gate oxide film interposed between them, and the gate electrode 106 is integrally formed together with a gate electrode wiring layer 111 formed on the device isolation film 102. Reference numerals 108 and 108 are side walls (side wall insulation films) formed on the side surfaces of the gate electrode 106, and the side walls 108, 108 are utilized as a part of a mask used in forming the high impurity concentration regions 103b and 104b of the pair of source/drain regions 103 and 104.

Reference numeral 109 is an interlayer insulation film, and this interlayer insulation film is formed over the device isolation film 102, the pair of source/drain regions 103 and 104, the gate electrode 106, and the side wall insulation films 108. Contact holes 109a and 109b are formed in this interlayer insulation film 109 so as to respectively communicate with the pair of source/drain regions 103 and 104. Reference numerals 110a and 110b are a pair of source/drain electrodes which are electrically connected to respective the pair of source/drain regions 103 and 104 through the contact holes 109a and 109b of the interlayer insulation film 109. A MOS transistor is made by the pair of source/drain electrodes 110a and 110b, the pair of source/drain regions 103 and 104, and the gate electrode 106.

For the device isolation film 102 formed by the LOCOS method, a part of the device isolation film 102, which is in contact with the device formation region of the semiconductor substrate 101, is gently tapered. By virtue of this gently tapered portion, it is possible to easily form a wiring layer around the tapered portion, that is, the gate electrode wiring layer 111 integrally formed with the gate electrode 106, without the necessity of taking into consideration the influence of a step, as shown in the drawing. However, in general, there arises a bird's beak geometry of 150 nm or thereabouts. This bird's beak geometry causes a mask size of the device formation region of the semiconductor substrate 101 to become narrower or smaller when compared with the size of the same in a photolithographic mask at the time of the formation of the device isolation film 102.

As shown in the drawings, if the device formation region is narrow, the contact holes 109a and 109b will be different from desired locations, for example, the center positions of the source/drain regions 103 and 104 because of the misalignment of the mask, the contact hole 109b will be formed at the edge of the device isolation film 102 when the contact holes 109a and 109b are formed in the interlayer insulation film 109. At this time, the semiconductor substrate 101 and the source/drain region 109b are short-circuited by the source/drain electrode 110b, and the device may not function as the MOS transistor.

To prevent this, it is necessary to make the size of the source/drain regions 103 and 104 larger by only a dimension of an alignment accuracy (a finite value) determined by the performance of an exposing apparatus which carries out photolithography, that is, a dimension la shown in FIG. 65. In other words, it is necessary to ensure sufficient distances between the contact hole 109a and the edge of the device isolation film 102 and between the contact hole 109b and the edge of the device isolation film 102 when the device is designed. This requirement hinders the high integration of a semiconductor integrated circuit device, in other words, the miniaturization of the device formation region.

When the gate electrode 106 is formed, or patterned, it is necessary for both ends of the gate electrode 106 to reliably stretch over the device isolation film 102, as shown in FIG. 66. If clearance is formed between the edges of the gate electrode 106 and the device formation film 102, ions will be also implanted into the clearance when the pair of source/drain regions 103 and 104 are formed in a self-aligned manner using the gate electrode 106 and the device isolation film 102 as a mask. As a result of this, the pair of source/drain regions 103 and 104 are electrically short-circuited, and the device fails to operate as a transistor.

As shown in FIG. 66, to prevent the electrical short-circuit between the pair of source/drain regions 103 and 104, it is necessary to ensure a dimension lb between the edge of the device isolation film 102 and the edge of the gate electrode 106 laid on the device isolation film 102, as a design margin when the device is designed. This design margin also serves as another factor to prevent the high integration of the device.

SUMMARY OF THE INVENTION

In view of the foregoing drawbacks in the prior art, an object of the present invention is to obtain a semiconductor device having a device isolation film suitable for high integration, and a manufacturing method therefor.

A second object of this invention is to obtain a semiconductor device having a device isolation film and a MIS transistor which are suitable for high integration, and a method of manufacturing the semiconductor device wherein a pair of source/drain electrodes of the MIS transistor, to be formed in the device formation region of a semiconductor substrate surrounded by the device isolation film, can be formed in a self-aligned manner.

A third object of this invention is to obtain a semiconductor device having a device isolation film and a MIS transistor which are suitable for high integration, and a method of manufacturing the semiconductor device wherein a gate electrode of a MIS transistor, which is formed in a device formation region of a semiconductor substrate surrounded by a device isolation film, and a gate electrode wiring layer to be connected to the gate electrode can be connected together without a step.

According to a first aspect of the present invention, the objects are achieved by a semiconductor device comprising a device isolation film, which is formed on a device isolation region on one major surface of a semiconductor substrate so as to surround a device formation region, is made of three layers. The three layers is made up of a first layer which is made of an insulation film formed on one major surface of the semiconductor substrate; a second layer which is formed on the surface of the first layer and is made of a material differing from that of the first layer; and a third layer which is an insulation film and is made of a material differing from that of the second layer.

According to a second aspect of the present invention, there is provided a semiconductor device comprising:
- a semiconductor substrate having a device formation region where a device is to be formed and a device isolation region surrounding the device formation region, both being on one major surface of the semiconductor substrate;
- a device isolation film having:
  - a first layer being made of an insulation film and formed on the device isolation region of the one major surface of the semiconductor substrate with an opening surrounding the device formation region;
  - a second layer being made of a material which differs from the material of the first layer and formed on the surface of the first layer with an opening surrounding the device formation region; and
  - a third layer being made of a material which differs from a material of the second layer, being formed on the surface of the second layer with an opening surrounding the device formation region, and being an insulation film; and
- a MIS transistor including:
  - a pair of source/drain region which is formed in the device formation region of the semiconductor substrate surrounded by the device isolation film in such a way that they are spaced apart from each other with a channel region sandwiched between them, and has PN junction ends being in contact with the first layer of the device isolation film;
  - a gate electrode which is formed on the channel region with a gate oxide film interposed between them; and
  - a pair of source/drain electrodes which are formed within the openings of the first to third layers of the device isolation film and electrically connected to the pair of the source/drain regions respectively, each of the source/drain electrodes being electrically insulated from the gate electrode.

According to a third aspect of the present invention, there is provided a semiconductor device comprising:
- a semiconductor substrate having a device formation region where a device is to be formed and a device isolation region surrounding the device formation region, both being on one major surface of the semiconductor substrate;
- a device isolation film having:
  - a first layer being made of an insulation film and formed on the device isolation region of the one major surface of the semiconductor substrate with an opening surrounding the device formation region;
  - a second layer being made of a material which differs from the material of the first layer and formed on the surface of the first layer with an opening surrounding the device formation region; and
  - a third layer being made of a material which differs from a material of the second layer, being formed on the surface of the second layer with an opening surrounding the device formation region, and being an insulation film; and
- a MIS transistor including:
  - a pair of source/drain regions which are formed in the device formation region of the semiconductor substrate surrounded by the device isolation film in such a way that they are spaced apart from each other with a channel region sandwiched between them, and have PN junction ends being in contact with the first layer of the device isolation film;
  - a gate electrode which is formed on the channel region with a gate oxide film interposed between them; and
  - a pair of source/drain electrodes which are formed within the openings of the first to third layers of the device isolation film and electrically connected to the pair of the source/drain regions respectively, each of the source/drain electrodes being electrically insulated from the gate electrode, wherein the openings of the first to third layers of the device isolation film are rectangular as viewed from above, the gate electrode has a pair of opposite side surfaces and a pair of opposite end surfaces, the pair of opposite end surfaces of the gate electrode are respectively in contact with two side surfaces of the device isolation film which surfaces correspond to two opposed sides of the openings of the device isolation film, and the opposite side surfaces of the gate electrode are electrically insulated from the pair of source/drain electrodes through side-wall insulation films respectively provided so as to contact with the pair of source/drain electrodes.

According to a fourth aspect of the present invention, there is provided a semiconductor device comprising:
- a semiconductor substrate having a device formation region where a device is to be formed and a device isolation region surrounding the device formation region, both being on one major surface of the semiconductor substrate;
- a device isolation film having:
  - a first layer being made of an insulation film and formed on the device isolation region of the one major surface of the semiconductor substrate with an opening surrounding the device formation region;
  - a second layer being made of a material which differs from the material of the first layer and formed on the surface of the first layer with an opening surrounding the device formation region; and
  - a third layer being made of a material which differs from a material of the second layer, being formed on the surface of the second layer with an opening surrounding the device formation region, and being an insulation film; and
- a MIS transistor including
  - a pair of source/drain regions which are formed in the device formation region of the semiconductor substrate surrounded by the device isolation film in such a way that they are spaced apart from each other with a channel region sandwiched between them, and have PN junction ends being in contact with the first layer of the device isolation film;

a gate electrode which is formed on the channel region with a gate insulation film interposed between them, and a pair of source/drain electrodes which are formed within the openings of the first to third layers of the device isolation film and electrically connected to the corresponding pair of the source/drain regions respectively, each of the source/drain electrodes being electrically insulated from the gate electrode; and a wiring layer for the gate electrode being formed on the surface of the third layer of the device isolation film and being electrically connected to the gate electrode.

According to a fifth aspect of the present invention, there is provided a semiconductor device comprising:

a semiconductor substrate having a device formation region where a device is to be formed and a device isolation region surrounding the device formation region, both being on one major surface of the semiconductor substrate;

a device isolation film having:

a first layer being made of a silicon oxide film and formed on the device isolation region of the one major surface of the semiconductor substrate with an opening surrounding the device formation region;

a second layer being made of a material which differs from the material of the first layer and formed on the surface of the first layer with an opening surrounding the device formation region; and a third layer being formed on the surface of the second layer with an opening surrounding the device formation region and having a silicon oxide film;

a MIS transistor including:

a gate electrode being formed in the device formation region of the semiconductor substrate surrounded by the device isolation film with side surfaces thereof being spaced apart from side surfaces of the opening of the device isolation film opposite to the side surfaces of the gate electrode, but with both end surfaces thereof being in contact with side surfaces of the opening of the device isolation film opposite to the end surfaces of the gate electrode, and the gate electrode being made of a polycrystalline silicon layer which is formed via a gate oxide film;

a pair of source/drain regions which are respectively positioned between the side surfaces of the gate electrode and the side surfaces of the opening of the device isolation film opposite to the side surfaces of the gate electrodes within the device formation region of the semiconductor substrate, and which have PN junction ends being in contact with the first layer of the device isolation film and another PN junction ends positioned directly below the gate electrode; and a pair of source/drain electrodes which are respectively insulated from the gate electrode and electrically connected to the corresponding pair of source/drain regions respectively, being formed within the opening of the device isolation film, and are a conductive layer that is a metal silicide layer made of such a material as tungsten silicide, titanium silicide, cobalt silicide, tantalum silicide, molybdenum silicide, nickel silicide, or platinum silicide, a metal nitride layer made of such a material as titanium nitride or tantalum nitride, a metal layer made of such a material as tungsten, tantalum, molybdenum, or cobalt, or a laminated body consisting of two or more of the above layers;

an interlayer insulation film which is formed on the device isolation film, the gate electrode, and the pair of source/drain electrodes, and which has a contact hole formed at a position aligned with at least one of the pair of source/drain electrodes; and a source/drain electrode wiring layer which is formed on the interlayer insulation film, is electrically connected to the source/drain electrodes through the contact hole, and is made of a conductive layer made of aluminum or an aluminum alloy.

According to a sixth aspect of the present invention, there is provided a method of manufacturing a semiconductor device comprising the steps of:

forming a first layer which consists of an insulation film, a second layer which consists of a material differing from the material of the first layer, and a third layer which is an insulation film and is made of a material differing from the material of the second layer, one on top of the other on one major surface of a semiconductor substrate having a device formation region where a device is to be formed and a device isolation region surrounding the device formation region;

forming a device isolation film having the first through third layers by etching the first through third layers, one after the other, to create an opening in the device formation region in such a way as to leave the first to third layers on the device isolation region of the semiconductor substrate; and forming a device within the device formation region of the semiconductor substrate surrounded by the device isolation film.

According to a seventh aspect of the present invention, there is provided a method of manufacturing a semiconductor device comprising the steps of:

forming a device isolation film on one major surface of a semiconductor substrate, the major surface having a device formation region where a device is to be formed and a device isolation region surrounding the device formation region, the device isolation film including first to third layers formed one on top of the other on the device isolation region so as to surround the device formation region with an opening being formed in the device formation region, the first layer being made of an insulation layer, the second layer consisting of a material differing from the material of the first layer, and the third layer being an insulation film and being made of a material differing from the material of the second layer;

forming a gate electrode on the gate insulation film within the opening of the device isolation film;

forming a pair of source/drain regions in the device formation region of the semiconductor substrate surrounded by the device isolation film using the gate electrode and the device isolation film as at least a part of a mask; and forming a pair of source/drain electrodes within the opening of the device isolation film, the source/drain electrodes being electrically connected to the corresponding pair of source/drain regions, respectively.

According to an eighth aspect of the present invention, there is provided a method of manufacturing a semiconductor device, comprising the steps of:

forming a device isolation film on one major surface of a semiconductor substrate in such a way as to surround a device formation region where a device is to be formed with an opening being formed in the device formation region, the device isolation film including a first layer which consists of an insulation film, a second layer which consists of a material differing from the material of the first layer, and a third layer which is an insulation film and is made of a material differing from the material of the second layer, formed one on top of the other on the one major surface of the semiconductor substrate;

forming a conductive layer on the surface of the device isolation film and the gate insulation film on the device formation region of the semiconductor substrate;

forming a gate electrode by forming a conductive layer on the surface of the device isolation film and the gate insulation film on the device formation region of the semiconductor substrate, removing the conductive layer from the surface of the device isolation film, forming a buried conductive layer within the opening of the device isolation film, and etching the buried conductive layer;

forming a pair of source/drain regions in the device formation region of the semiconductor substrate surrounded by the device isolation film using the gate electrode and the device isolation film as at least a part of a mask; and forming a pair of source/drain electrodes within the opening of the device isolation film, the pair of source/drain electrodes being electrically connected to the corresponding pair of source/drain regions, respectively.

According to a ninth aspect of the present invention, there is provided a method of manufacturing a semiconductor device, comprising the steps of:

forming a device isolation film on one major surface of a semiconductor substrate, the major surface having a device formation region where a device is to be formed and a device isolation region surrounding the device formation region, the device isolation film including first to third layers one on top of the other on the device isolation region so as to surround the device formation region with an opening being formed in the device formation region, the first layer being made of an insulation layer, the second layer being made of a material which is different from that of the first layer, and the third layer being made of an insulation film which is different from that of the second layer;

forming a gate electrode on a gate insulation film within the opening of the device isolation film;

forming a pair of source/drain regions in the device formation region of the semiconductor substrate surrounded by the device isolation film by implanting impurities into the one major surface of the semiconductor substrate using the gate electrode and the device isolation film as a mask to form impurity regions having a low impurity concentration, forming side-wall insulation films on the side surfaces of the opening of the device isolation film and side surfaces of the gate electrode, and implanting impurities into the one major surface of the semiconductor substrate using the gate electrode, the device isolation film, and the side-wall insulation films as a mask to form impurity regions having a high impurity concentration, the pair of source/drain regions being made up of the low impurity concentration regions and the high impurity concentration region; and forming a pair of source/drain electrodes by forming a conductive layer on the surfaces of the pair of source/drain regions, the side-wall insulation films, and the device isolation film, removing the conductive layer from the surface of the device isolation film, and forming buried conductive layers, between the side-wall insulation films formed on the side surfaces of the opening of the device isolation film and the side-wall insulation films formed on the side surfaces of the gate electrode, within the opening of the device isolation film.

According to a tenth aspect of the present invention, there is provided a method of manufacturing a semiconductor device, comprising the steps of:

forming a device isolation film on one major surface of a semiconductor substrate, the major surface having a device formation region where a device is to be formed and a device isolation region surrounding the device formation region, the device isolation film including first to third layers formed one on top of the other on the device isolation region so as to surround the device formation region with an opening being formed in the device formation region, the first layer being made of an insulation film, the second layer being made of an insulation film differing from the first layer, and the third layer being made of an insulation film differing from the second layer;

forming a gate electrode of a MIS transistor on the gate insulation film within the opening of the device isolation film;

forming a pair of source/drain regions of the MIS transistor in the device formation region of the semiconductor substrate surrounded by the device isolation film using the gate electrode and the device isolation film as at least a part of a mask;

forming side-wall insulation films on side surfaces of the opening of the device isolation film and side surfaces of the gate electrode, the side-wall insulation films consisting of an insulation film which is the same as that of the second layer of the device isolation film;

forming a pair of source/drain electrodes of the MIS transistor which are surrounded by the side wall insulation film on the side surfaces of the opening of the device isolation film, and are electrically connected to the corresponding pair of source/drain regions, respectively;

removing top portions of the side-wall insulation films;

forming a wiring groove for a gate electrode so as to expose a portion of an end surface of the gate electrode by etching a predetermined region of the third layer of the device isolation film using the second layer and the side-wall insulation films as an etching stopper; and forming a wiring layer for a gate electrode within the gate electrode wiring groove, the gate electrode wiring layer being electrically connected to the end surface of the gate electrode.

According to an eleventh aspect of the present invention, there is provided a method of manufacturing a semiconductor device, comprising the steps of:

forming a device isolation film on one major surface of a semiconductor substrate, the major surface having a device formation region where a device is to be formed and a device isolation region surrounding the device formation region, the device isolation film including first to third layers formed one on top of the other on the device isolation region so as to surround the device formation region with an opening being formed in the device formation region, the first layer being made of an insulation film, the second layer being made of a conductive material layer, and the third layer consisting of the first insulation film and the second insulation film made of a material different than the first insulation film;

forming a gate electrode of a MIS transistor on the gate insulation film within the opening of the device isolation film;

forming a pair of source/drain regions of the MIS transistor in the device formation region of the semiconductor substrate surrounded by the device isolation film using the gate electrode and the device isolation film as at least a part of a mask;

forming side-wall insulation films on side surfaces of the opening of the device isolation film and side surfaces of the gate electrode, the side-wall insulation films made of the same insulative material as the first insulation film of the third layer of the device isolation film;

forming a pair of source/drain electrodes of the MIS transistor which are surrounded by the side wall insulation film on the side surfaces of the opening of the device isolation film, and are electrically connected to the corresponding pair of source/drain regions, respectively;

removing top portions of the side-wall insulation films;

forming a wiring groove for a gate electrode so as to expose a portion of an end surface of the gate electrode by etching a predetermined region of the second insulation film of the third layer of the device isolation film using the first insulation film and the side-wall insulation films as an etching stopper; and forming a wiring layer for a gate electrode within the gate electrode wiring groove, the gate electrode wiring layer being electrically connected to the end surface of the gate electrode.

In the first aspect of the present invention, the first to third layers of the device isolation film do not adversely affect the surface of the device formation region of the semiconductor substrate when the first to third layers are formed, and the device formation region is defined with superior accuracy.

In the second aspect of the present invention, the first to third layers of the device isolation film do not adversely affect the surface of the device formation region of the semiconductor substrate when the first to third layers are formed, and the device formation region is defined with superior accuracy. Moreover, the pair of source/drain regions and the pair of source/drain electrodes can be formed in a self-aligned manner by means of the device isolation film and the gate electrode.

In the third aspect of the present invention, the first to third layers of the device isolation film do not adversely affect the surface of the device formation region of the semiconductor substrate when the first to third layers are formed, and the device formation region is defined with superior accuracy. Moreover, the pair of source/drain regions can be formed in a self-aligned manner by means of the device isolation film and the gate electrode, and the pair of source/drain electrodes can be also formed in a self-aligned manner by means of the device isolation film, the gate electrode, and the side wall insulation film.

In the fourth aspect of the present invention, the first to third layers of the device isolation film do not adversely affect the surface of the device formation region of the semiconductor substrate when the first to third layers are formed, and the device formation region is defined with superior accuracy. Moreover, the gate electrode wiring layer and the gate electrode are reliably connected together without a step. The pair of source/drain regions and the pair of source/drain electrodes can be formed in a self-aligned manner by means of the device isolation film and the gate electrode.

In the fifth aspect of the present invention, the first to third layers of the device isolation film do not adversely affect the surface of the device formation region of the semiconductor substrate when the first to third layers are formed, and the device formation region is defined with superior accuracy. The pair of source/drain regions and the pair of source/drain electrodes can be formed in a self-aligned manner by means of the device isolation film and the gate electrode. The source/drain electrodes act as a barrier layer with respect to diffusion from the source/drain electrode wiring layers to the source/drain regions.

In the sixth aspect of the present invention, the first to third layers are formed one on top of the other, and the layers are etched one after the other to form an opening in the device formation region. The formation of the first to third layers does not adversely affect the surface of the device formation region of the semiconductor substrate, and the device formation region is defined with superior accuracy.

In the seven aspect of the present invention, the first to third layers are formed one on top of the other, and the layers are etched one after the other to form an opening in the device formation region. The formation of the first to third layers does not adversely affect the surface of the device formation region of the semiconductor substrate, and the device formation region is defined with superior accuracy. Moreover, the pair of source/drain regions are formed in a self-aligned manner using the gate electrode and the device isolation film as at least a mask, and the source/drain electrodes are formed in a self-aligned manner within the opening of the device isolation film.

In the eighth aspect of the present invention, the first to third layers are formed one on top of the other, and the layers are etched one after the other to form an opening in the device formation region. The formation of the first to third layers does not adversely affect the surface of the device formation region of the semiconductor substrate, and the device formation region is defined with superior accuracy. Moreover, the gate electrode is formed with superior accuracy within the opening of the device isolation film. Further, the pair of source/drain regions are formed in a self-aligned manner using the gate electrode and the device isolation film as at least a mask, and the source/drain electrodes are formed in a self-aligned manner within the opening of the device isolation film.

In the ninth aspect of the present invention, the first to third layers are formed one on top of the other, and the layers are etched one after the other to form an opening in the device formation region. The formation of the first to third layers does not adversely affect the surface of the device formation region of the semiconductor substrate, and the device formation region is defined with superior accuracy. Moreover, the pair of source/drain regions are formed in a self-aligned manner using the gate electrode and the device isolation film as at least a mask, and the source/drain electrodes are formed in a self-aligned manner within the opening of the device isolation film using the side-wall insulation films as a part of a mask.

In the tenth aspect of the present invention, the first to third layers are formed one on top of the other, and the layers are etched one after the other to form an opening in the device formation region. The formation of the first to third layers does not adversely affect the surface of the device formation region of the semiconductor substrate, and the device formation region is defined with superior accuracy. The wiring groove for a gate electrode is formed with superior accuracy, and the gate electrode wiring layer to be embedded into the gate electrode wiring groove is reliably insulated from the pair of source/drain electrodes. The gate electrode wiring layer is electrically connected to the end surface of the gate electrode.

In the eleventh aspect of the present invention, the first to third layers are formed one on top of the other, and the layers are etched one after the other to form an opening in the device formation region. The formation of the first to third layers does not adversely affect the surface of the device formation region of the semiconductor substrate, and the device formation region is defined with superior accuracy. The wiring groove for a gate electrode is formed with superior accuracy, and the gate electrode wiring layer to be embedded into the gate electrode wiring groove is reliably insulated from the pair of source/drain electrodes. The gate electrode wiring layer is electrically connected to the end surface of the gate electrode.

The present invention is particularly advantageous in being capable of providing a semiconductor device that has a device isolation film and a MIS transistor both suitable for high degree of integration. Further, the invention is advantageous in that the gate electrode wiring line can positively be connected to the gate electrode because there exists no step between them.

DESCRIPTION OF THE PREFERRED EMBODIMENTS

First Embodiment

Figure 1:
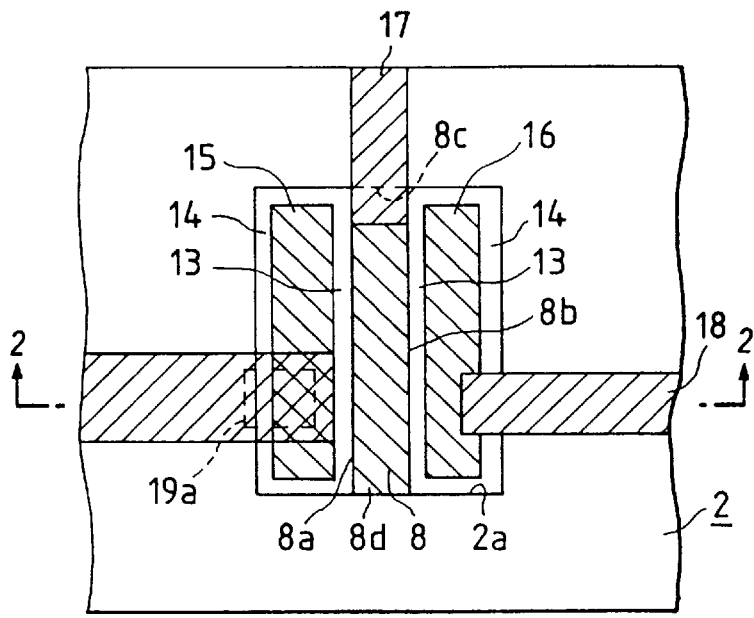
FIG. 1 is a plan view showing the principal elements of a semiconductor device in a first embodiment of the present invention.
Figure 2:
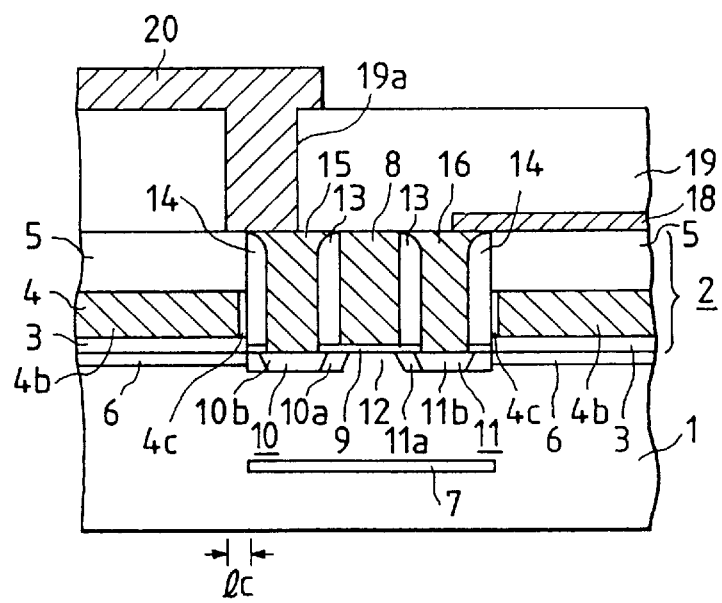
FIG. 2 is a cross-sectional view taken along line 2—2 in FIG. 1.

FIGS. 1 and 2 show a semiconductor device in a first embodiment of the present invention. FIGS. 1 and 2 are projection plan view and a cross sectional view showing a MIS transistor (an n-type MOS transistor in this embodiment) which is formed on a device isolation film and a device formation region on one major surface of a semiconductor substrate surrounded by the device isolation film. In the drawings, reference numeral 1 designates a semiconductor substrate consisting of a silicon substrate having one conductivity type (a p-type conductivity in this embodiment).

Reference numeral 2 designates a device isolation film formed on the device isolation region of the semiconductor substrate 1 so as to surround the device formation region with a rectangular opening 2a. The device isolation film is made up of a first layer 3, a second layer 4, and a third layer 5. The first layer 3 is made of an insulation film such as a silicon oxide film having a thickness of, for example, 20 nm, and is formed by thermal oxidation or chemical vapor deposition. The first layer 3 has an opening 3a which is rectangular as viewed from above and is formed in the device isolation region on the one major surface of the semiconductor substrate 1 so as to surround the device formation region. The second layer 4 is made of a material differing from the material of the first layer and formed on the surface of the first layer 3 with an opening 4a, this opening 4a is rectangular as viewed from above and surrounds the device formation region. The second layer 4 is made up of a polycrystalline silicon film 4b which has a thickness of, for example, 100 nm and is formed by CVD, and a silicon oxide film 4c which is formed on side surfaces of the polycrystalline silicon film 4b facing the device formation region by thermally oxidizing the polycrystalline silicon film 4b. The third layer 5 is formed on the surface of the second layer 2 and has an opening 5a which is rectangular as viewed from above and surrounds the device formation region. The third layer 5 consists of, for example, a silicon oxide film which has a thickness of 400 nm and is formed by CVD, and is made of an insulation film differing from the material of the second layer 4.

The polycrystalline silicon layer 4b, constituting the second layer 4, provides field shield isolation when a predetermined electric potential, for example, a ground potential is applied to the polycrystalline silicon layer 4b. For example, if the semiconductor substrate 1 is placed at a ground potential, a contact hole which communicates with the major surface of the semiconductor substrate 1 will be formed in the first layer 3. The polycrystalline silicon layer 4b will be electrically connected to the semiconductor substrate 1 (which also acts as a wiring layer having a predetermined electric potential) via the contact hole. The second layer 4 may be other metal silicides of the polycrystalline silicon.

Reference numeral 6 is a first impurity region formed on the surface of the device isolation region of the semiconductor substrate 1. This first impurity region 6 has the same conductivity type as the semiconductor substrate 1 but a higher impurity concentration when compared with the semiconductor substrate 1. The first impurity region 6 acts as a channel stopper region. Reference numeral 7 designates a second impurity region. The second impurity region 7 is formed at a predetermined depth from the surface of the device formation region of the semiconductor substrate 1, for example, the impurity region 7 being formed at a depth of several hundred nanometers. The second impurity region 7 has the same conductivity type as the semiconductor substrate 1 but a higher impurity concentration when compared with the semiconductor substrate 1. The second impurity region 7 is formed at the same time the first impurity region 6 is formed.

Figure 66:
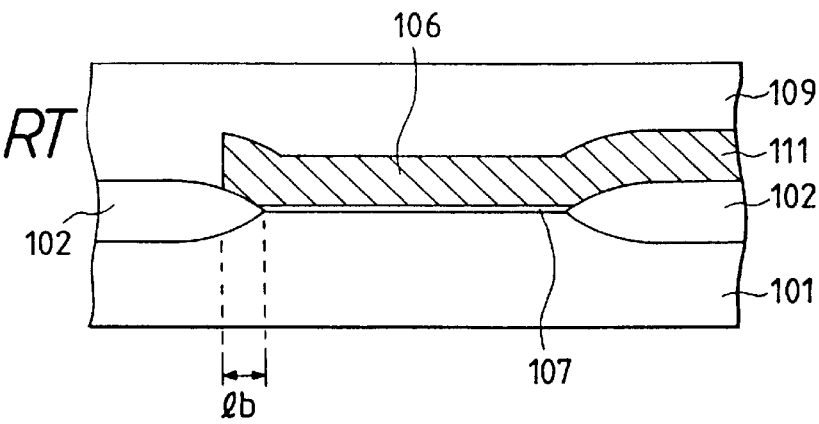
FIG. 66 is a cross-sectional view showing the principal elements of the conventional semiconductor device.

Reference numeral 8 designates a gate electrode. Both side surfaces 8a and 8b of this gate electrode 8 are spaced apart from side surfaces of the opening 2a of the device isolation film 2 opposite to the side surfaces 8a and 8b. On the contrary, both end surfaces 8c and 8d of the gate electrode 8 are in contact with side surfaces of the opening 2a of the device isolation film 2 opposite to the end surfaces 8c and 8d. The gate electrode 8 is made of a polycrystalline silicon layer or a polycrystalline silicon layer doped with impurities such as phosphorous or boron, the polycrystalline silicon layer being formed with a gate oxide film 9 interposed between the polycrystalline silicon layer and the semiconductor substrate 1. The thickness of the gate electrode is the same as the thickness of the device isolation film 2, that is, the total thickness of the first layer 3 to the third layer 5. An upper surface of the gate electrode 8 is substantially flush with the front surface of the third layer 5 of the device isolation film 2. In this embodiment, the both end surfaces 8c and 8d are in contact with the side surfaces of the opening 2a of the device isolation film 2. For this reason, even if the gate electrode 8 is used as a part of a mask when a pair of source/drain regions, which will be described later, are formed, the source/drain regions will not be short-circuited. In contrast to the conventional semiconductor device shown in FIG. 66, it is not necessary to consider the dimension eb from the end of the device isolation film 102 to the end of the gate electrode 106 situated on the device isolation film 102. Hence, high integration of the semiconductor device will be implemented.

Reference numerals 10 and 11 are a pair of source/drain regions formed between the side surfaces 8a and 8b of the gate electrode 8 and the side surfaces of the opening 2a of the device isolation film 2 opposite to the side surfaces 8a and 8b within the device formation region of the semiconductor substrate 1. The pair of source/drain regions 10 and 11 have a PN junction end which is in contact with the first layer 3 of the device isolation film 2, and a PN junction end which is positioned directly below the gate electrode 8. The source/drain regions 10 and 11 are made up of low impurity concentration regions 10a and 11a in which arsenic (As) is implanted in this embodiment, and high impurity concentration regions 10b and 11b. A channel region 12 is formed between the pair of source/drain regions 10 and 11.

Reference numerals 13, 13 are first side wall insulation films (side walls) formed on the-side surfaces 8a and 8b of the gate electrode 8. The width of the side wall insulation film is, for example, about 50 to 100 nm at a plane where the side wall insulation film is in contact with the semiconductor substrate 1. This first side wall insulation films 13 are insulation films consisting of a silicon oxide film which is made by CVD. The first side wall insulation films 13 are used as a part of the mask when the high impurity concentration regions 10b and 11b of the pair of source/drain regions 10 and 11 are formed. The first side wall insulation films 13 also cause source/drain electrodes, which will be described later, to be formed in a self-aligned manner, and electrically insulate the source/drain electrodes from the gate electrode 8.

Reference numerals 14 are second side wall insulation films formed along the side surfaces of the opening 2a of the device isolation film 2, other than the side surfaces which are in contact with the gate electrode 8. The width of the second side wall insulation film 14 is, for example, 50 to 100 nm at a position where the second side wall insulation film 14 is in contact with the semiconductor substrate 1. The second side wall insulation film 14 is an insulation film consisting of a silicon oxide film which is made by CVD. The second side wall insulation films 14 are formed at the same time the first side wall insulation films 13 are formed.

Figure 65:
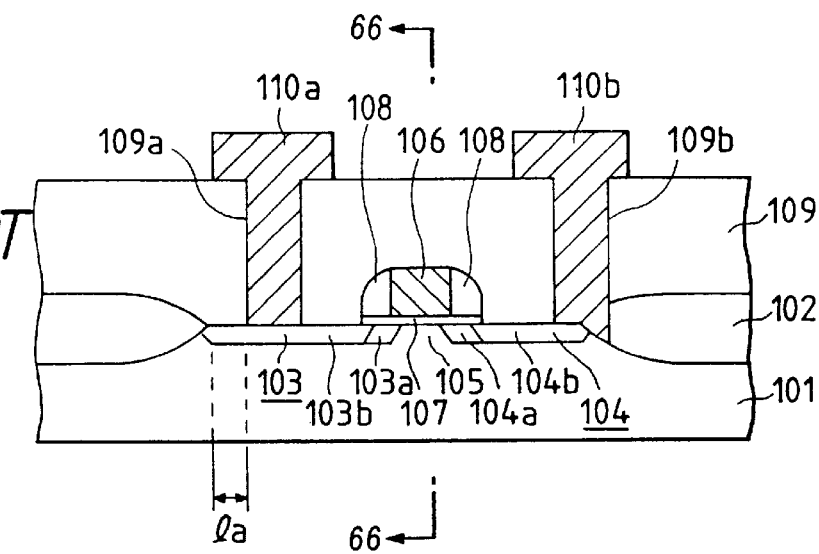
FIG. 65 is a cross-sectional view showing the principal elements of a conventional semiconductor device.

Reference numerals 15 and 16 designate a pair of source/drain electrodes which are electrically insulated from the gate electrode 8 by means of the first side wall insulation films 13. The pair of source/drain electrodes 15 and 16 are electrically connected to the corresponding pair of source/drain regions 10 and 11. The source/drain electrodes 15 and 16 are made of a polycrystalline silicon layer or a polycrystalline silicon layer doped with impurities such as phosphorous or boron. The thickness of the source/drain electrodes 15 and 16 is the same as the thickness of the device isolation film 2, that is, the total thickness of the first layer 3 to the third layer 5. Upper surfaces of the source/drain regions 15 and 16 are substantially flush with the front surface of the third layer 5 of the device isolation film 2. In this embodiment, the side wall insulation films 13 and 14 are formed as a part of the mask, it is unnecessary to consider a distance (the dimension la) between the contact hole 19a and the edge of the device isolation film 2, as contrasted with the conventional semiconductor device shown in FIG. 65, whereby the device formation region of the semiconductor substrate 1 is miniaturized. Even if the source/drain electrodes 15 and 16 are in close contact with the source/drain regions 10 and 11, and a titanium nitride layer is used for the source/drain electrodes 15 and 16, a drop in the impurity concentration of the source/drain regions 10 and 11, resulting from the diffusion of the impurities of the source/drain regions 10 and 11 into the source/drain electrodes 15 and 16, will not occur. The source/drain electrodes 15 and 16 act as a barrier layer with respect to the diffusion of impurities.

The n-type MOS transistor is formed within the device formation region of the semiconductor substrate 1 surrounded by the device isolation film 2, that is, within the region which is exposed at the opening 2a. The n-type MOS transistor is made up of the gate electrode 8, the pair of source/drain regions 10 and 11, and the pair of source/drain electrodes 15 and 16.

Reference numeral 17 is a wiring layer for a gate electrode use which is formed on the upper surface of the third layer 5 of the device isolation film 2 and is electrically connected to the upper surface of the gate electrode 8. The gate electrode wiring layer 17 is formed by sputtering or CVD. The gate electrode wiring layer 17 is made of a conductive material layer which has a thickness of, for example 50 nm, and the conductive layer is selected from the group comprising a polycrystalline layer; a metal silicide layer such as tungsten silicide, titanium silicide, cobalt silicide, tantalum silicide, molybdenum silicide, or platinum silicide; a metal nitride film layer such as titanium nitride, or tantalum nitride; a metal layer such as tungsten, tantalum, molybdenum, or cobalt; a metal layer such as aluminum; or a laminated body consisting of two or more of above. In this embodiment, as shown in the drawings, the upper surface of the gate electrode 8 and the front surface of the third layer 5 of the device isolation film 2 are flush with each other, and hence the gate electrode wiring layer is easy to form.

Reference numeral 18 is one of source/drain electrode wiring layers which are formed on the upper surface of the third layer 5 of the device isolation film 2, and the source/drain electrode wiring layer 18 is electrically connected to the upper surface of the source/drain electrode 16 of the pair of source/drain electrodes 15 and 16. This source/drain electrode wiring layer 18 is formed by sputtering or CVD, and is made of a conductive material layer which has a thickness of, for example, 50 nm and is selected from the group comprising a polycrystalline layer; a metal silicide layer such as tungsten silicide, titanium silicide, cobalt silicide, tantalum silicide, molybdenum silicide, or platinum silicide; a metal nitride film layer such as titanium nitride, or tantalum nitride; a metal layer such as tungsten, tantalum, molybdenum, or cobalt; a metal layer such as aluminum; or a laminated body consisting of two or more of above. This source/drain electrode wiring layer 18 is formed at the same time gate electrode wiring layer 17 is formed. In this embodiment, as illustrated in the drawings, the upper surface of the source/drain electrode 16 is flush with the upper surface of the third layer 5 of the device isolation film 2, and hence the source/drain electrode wiring layer 18 is easy to form. It is completely unnecessary to consider a distance (the dimension la) between the contact hole 19a and the edge of the device isolation film 2, as contrasted with the conventional semiconductor device shown in FIG. 65, whereby the device formation region of the semiconductor substrate 1 is miniaturized.

Reference numeral 19 is an interlayer insulation film, and this interlayer insulation film 19 is formed over the device isolation film 2, the gate electrode 8, the pair of source/drain electrodes 15 and 16, the side wall insulation films 13 and 14, the gate electrode wiring layer 17, and the source/drain electrode 18. A contact hole 19a is formed in the interlayer insulation film 19 above the source/drain electrode of the pair of source/drain electrodes 15 and 16. The interlayer insulation film 19 is made of a silicon oxide film which is laminated to a thickness of 800 nm by, for example, CVD. In this embodiment, the contact hole 19a may be positioned in such a way that a part of the contact hole 19a is overlapped with the upper surface of the device isolation film 2. (As a matter of course, the whole of a contact hole 19 can be positioned over the source/drain electrode 15). It is completely unnecessary to consider a distance (the dimension la) between the contact hole 19a and the edge of the device isolation film 2, as contrasted with the conventional semiconductor device shown in FIG. 65, whereby the device formation region of the semiconductor substrate 1 is miniaturized.

Reference numeral 20 is another source/drain electrode wiring layer which is electrically connected to the source/drain electrode 15. If the source/drain electrode 15 is made of a polycrystalline silicon film, a barrier layer consisting of a metal nitride film such as titanium nitride will be provided as a substrate layer, and the source/drain electrode wiring layer will be formed over the barrier layer, for example, as an aluminum layer, an aluminum alloy layer, or a conductive layer consisting of copper, each having a thickness of 500 nm. If the source/drain electrode 15 is made of a refractory metal nitride film layer, a refractory metal layer, or a laminated body consisting of them, and particularly if the source/drain electrode 15 is made of a titanium nitride layer which is in contact with the source/drain region 10, the source/drain electrode 15 will act as a barrier layer. For this reason, the source/drain electrode wiring layer will be formed, for example, as an aluminum layer, an aluminum alloy layer, or a single copper layer, each having a thickness of 500 nm.

A method of manufacturing the semiconductor device having such a construction, and particularly, a method of forming the device isolation film 2 and a method of manufacturing a MOS transistor will be chiefly described with reference to FIGS. 3 through 16.

Figure 3:
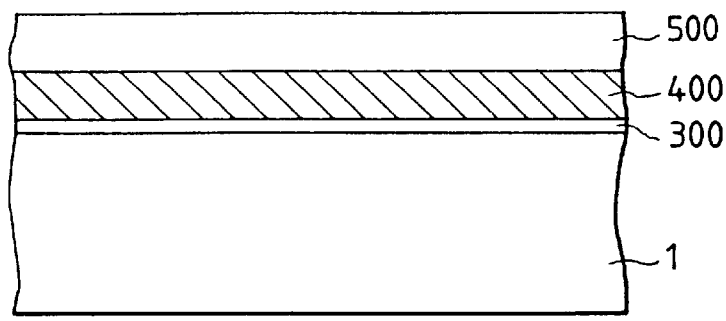
FIG. 3 is a cross-sectional view showing the principal elements of the semiconductor device arranged in sequential order of steps of a manufacturing method in the first embodiment of the present invention.

As shown in FIG. 3, a silicon oxide film 300 having a thickness of, for example, 20 nm is formed over one major surface of the semiconductor substrate 1 which consists of a silicon substrate having a first conductivity type (a p-type conductivity in this embodiment) by thermal oxidation or CVD. Then, a polycrystalline silicon film 400 having a thickness of, for example, 100 nm is formed over the silicon oxide film 300 by CVD, and a silicon oxide film 500 having a thickness of, for example, 400 nm is formed on the surface of the polycrystalline silicon film 400 by CVD.

A ground potential is applied to the polycrystalline silicon layer 400 for the purpose of field shield isolation. Hence, in order to apply the ground potential to the semiconductor substrate 1, the polycrystalline silicon film 400 will be electrically connected to the semiconductor substrate 1, provided that a contact hole reaching to the one major surface of the semiconductor substrate 1 is formed at a predetermined position of the silicon oxide film 300 prior to the formation of the polycrystalline silicon 400 by the use of well known photolithography technique and etching technique.

Figure 4:
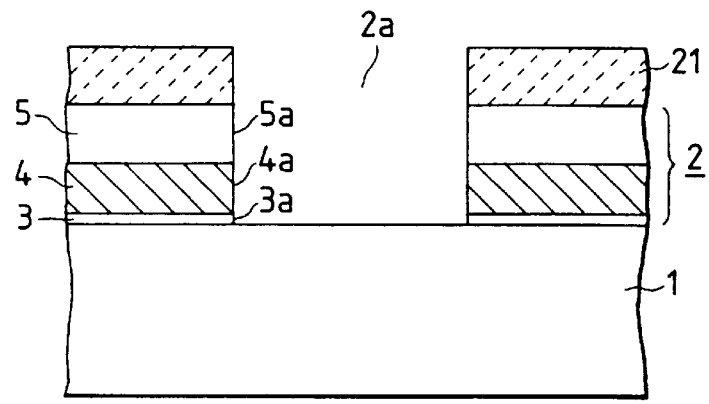
FIG. 4 is a cross-sectional view showing the principal elements of the semiconductor device arranged in sequential order of steps of a manufacturing method in the first embodiment of the present invention.

As shown in FIG. 4, a photoresist is applied over the surface of the silicon oxide film 500, and a resist layer 21 is formed by etching the opening 21*a* aligned with the device formation region which is rectangular as viewed from above. The silicon oxide film 500 is etched by an etching gas, for example, $CF_4$ or $CHF_3$ using the resist layer 21 as a mask and also using the polycrystalline silicon layer 400 as an etching stopper. The polycrystalline silicon film 400 is then etched by, for example, an etching gas such as $Cl_2$ or $SF_6$ using the silicon oxide film 300 as an etching stopper. Finally, the silicon oxide film 300 is etched by an etching gas, for example, $CF_4$ or $CHF_3$. As a result of this, the device isolation film 2 is formed which has the first layer 3, the second layer 4, and the third layer 5 respectively have openings 3*a*, 4*a*, and 5*a* aligned with the device formation region of the semiconductor substrate 1.

When the silicon oxide film 500, the polycrystalline silicon film 400, the silicon oxide film 300 are etched, about 10% overetching is usually carried out allowing for the evenness of the etch rate. In this embodiment, since the polycrystalline silicon layer 400 having a different etch rate is interposed between the oxide films, it is possible to reduce the thickness of the first silicon oxide layer 3 formed on, while remaining in contact with, the one major surface of the semiconductor substrate 1 to as thin as, for example, 20 nm by virtue of the presence of the polycrystalline silicon layer 400. As a result of this, it is possible to reduce the degree of the overetching of the silicon oxide film 300 performed when the first layer 3 is formed, and hence it is possible to reduce a period of time, during which the surface of the device formation region of the semiconductor substrate is exposed to plasma such as C or F, to as little as possible. It is therefore possible to prevent the semiconductor substrate 1 from being contaminated with impurities such as C or F, thereby resulting in a device (a MOS transistor), whose characteristic is not so deteriorated, being formed in the device formation region. In other words, when the MOS transistor is formed, the inclusion of impurities such as C or F in the surface of the semiconductor substrate 1 causes the evenness of the thickness of the gate oxide film of the MOS transistor to be deteriorated, or causes the quality of the film to be impaired as a result of the inclusion of impurities such as C or F into the gate oxide film. However, these problems are prevented, and hence the characteristics of the MOS transistor are not deteriorated.

In this embodiment, it is also possible to reduce the thickness of the first layer 3 to as thin as, for example, 20 nm. Hence, it is possible to remove a remaining silicon oxide film, which has a thickness of about several nanometers and is produced because of unevenness in etch rate, using an aqueous solution of diluted HF without overetching. This makes it possible to form the opening 3*a* of the first layer 3 with even less damage.

Figure 5:
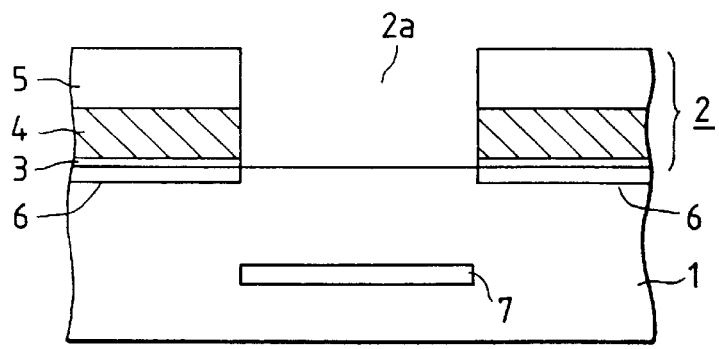
FIG. 5 is a cross-sectional view showing the principal elements of the semiconductor device arranged in sequential order of steps of a manufacturing method in the first embodiment of the present invention.

As shown in FIG. 5, after the resist layer 21 has been removed by ashing or the like, impurities having the same conductivity type as the semiconductor substrate 1, i.e., p-type impurities in this embodiment, for example boron, are implanted into the semiconductor substrate 1 with an implant energy of several hundred keV at a dose of $10^{12}$–$10^{13}$ $cm^{-2}$. The implanted impurities act as a channel stopper region at the surface of the device isolation region of the semiconductor substrate 1, that is, the surface directly below the device isolation film 2. In other words, the first impurity region 6 having a higher impurity concentration compared with the semiconductor substrate 1 is formed in a self-aligned manner in relation to the device isolation film 2, and the second impurity region 7 having a higher impurity concentration compared with the semiconductor substrate 1 is formed at a predetermined depth from the surface of the device formation region of the semiconductor substrate 1, for example, a position spaced apart, for example, several hundred nanometers from the surface of the device formation region of the semiconductor substrate 1.

Figure 6:
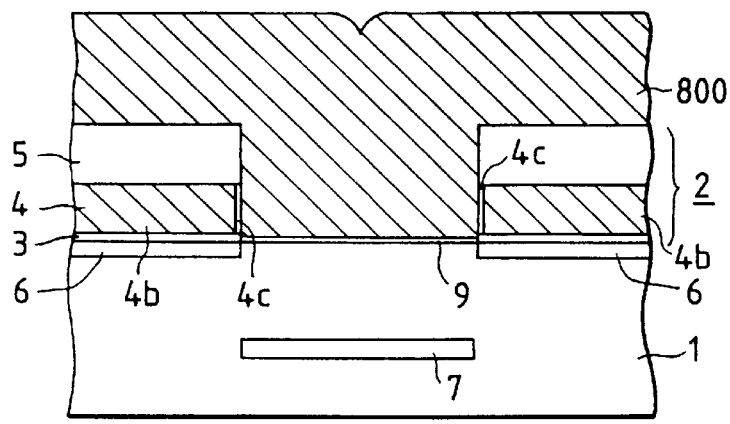
FIG. 6 is a cross-sectional view showing the principal elements of the semiconductor device arranged in sequential order of steps of a manufacturing method in the first embodiment of the present invention.

Then, as shown in FIG. 6, the surface of the device formation region of the semiconductor substrate 1 and the side surfaces of the opening 4*a* of the second polycrystalline silicon layer 4 are oxidized by thermal oxidization, whereby silicon oxide films are formed on the respective surfaces. The silicon oxide film, formed on the surface of the device formation region of the semiconductor substrate 1 at this time, is used as the gate insulation film 9. On the other hand, the silicon oxide film formed over the side surfaces of the opening 4*a* of the second polycrystalline silicon film 4 is used as the silicon oxide film 4*c* to insulate the gate electrode 8 from the polycrystalline silicon 4*b* of the second layer 4.

Figure 7:
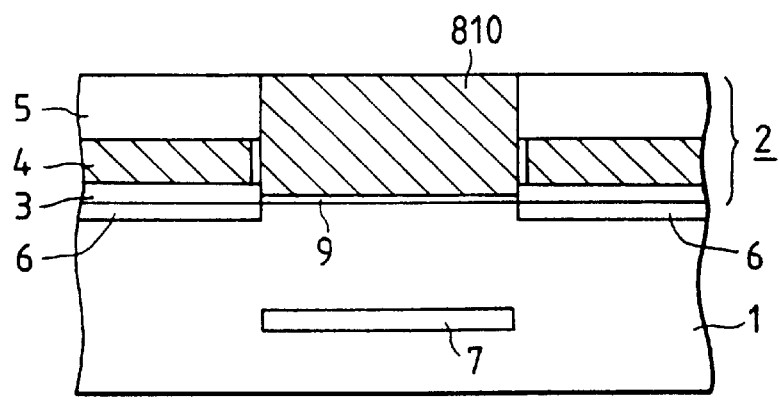
FIG. 7 is a cross-sectional view showing the principal elements of the semiconductor device arranged in sequential order of steps of a manufacturing method in the first embodiment of the present invention.

A polycrystalline silicon layer 800 (which may be doped with impurities such as phosphorous or boron) which is used in forming the gate electrode 8 by CVD is formed over the whole of one major surface of the semiconductor substrate 1, i.e., formed over the device formation region and the device isolation film 2. As shown in FIG. 7, the thickness of the polycrystalline silicon layer 800 is reduced by polishing or dry etching to such an extent that the surface of the third layer 5 of the device isolation film 2 is revealed, as a result of which a buried polycrystalline silicon layer 810 is formed only within the opening 2*a* of the device isolation film 2. The thickness of this buried polycrystalline silicon layer 810 is the same as the thickness of the device isolation film 2, and the surface of the buried polycrystalline silicon layer 810 is flush with the surface of the third layer 5, thereby resulting in a continuous smooth surface.

Figure 8:
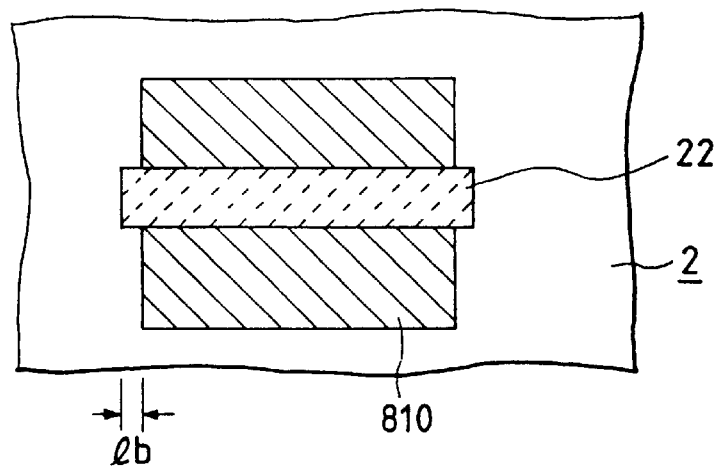
FIG. 8 is a plan view showing the principal elements of the semiconductor device arranged in sequential order of steps of a manufacturing method in the first embodiment of the present invention.
Figure 9:
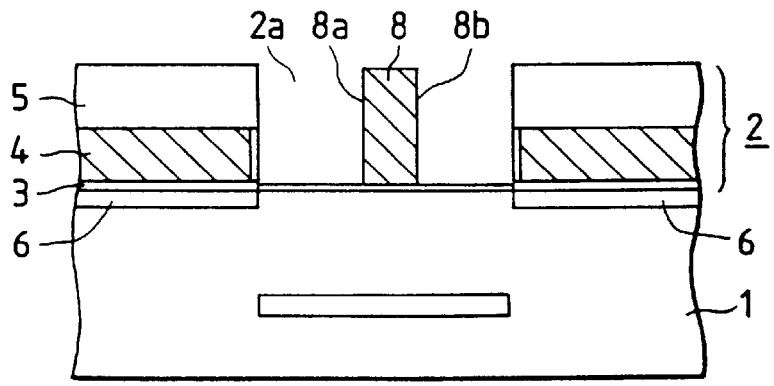
FIG. 9 is a cross-sectional view showing the principal elements of the semiconductor device arranged in sequential order of steps of a manufacturing method in the first embodiment of the present invention.
Figure 10:
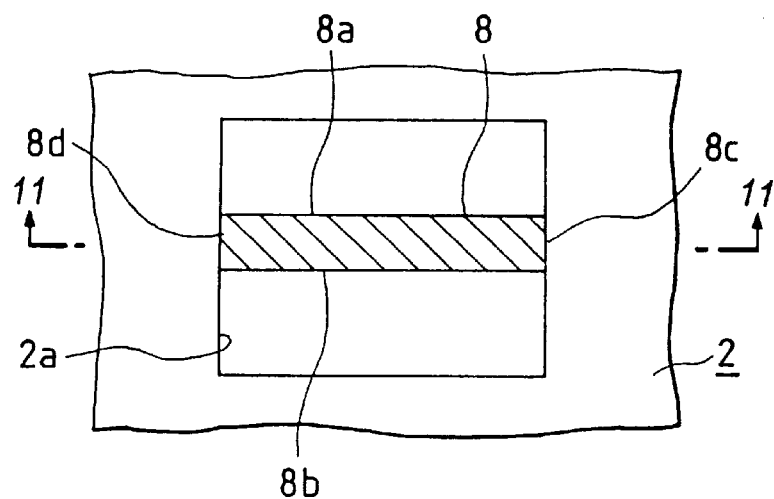
FIG. 10 is a plan view showing the principal elements of the semiconductor device arranged in sequential order of steps of a manufacturing method in the first embodiment of the present invention.
Figure 11:
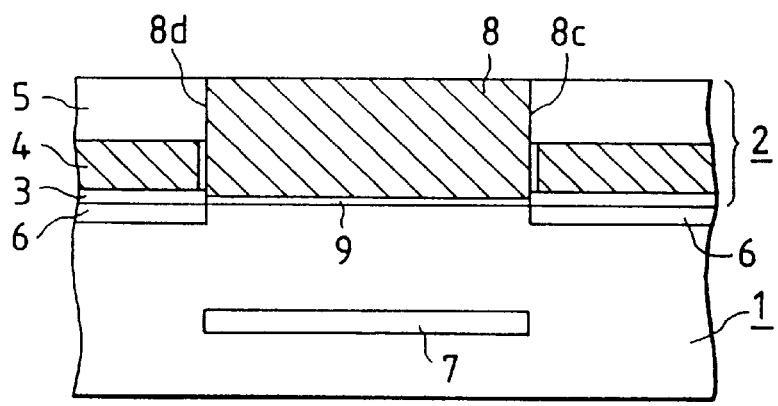
FIG. 11 is a cross-sectional view taken along line 11—11 in FIG. 10.

As shown in a plan view of FIG. 8, a resist layer 22 is formed using well known photolithography or etching technique so as to ensure the place where the gate electrode is situated. The resist layer 22 is formed so as to have an overlap lb as shown in FIG. 8 allowing for alignment accuracy. The buried polycrystalline silicon layer 810 is etched by known etching technique using the resist layer 22 as a mask, whereby the gate electrode 8 is formed as shown in FIGS. 9 through 11. At this time, the etching of the buried polycrystalline silicon layer 810 includes only the etching of the buried polycrystalline silicon layer 810. The thickness of the buried polycrystalline silicon layer 810 is determined by the thickness of the device isolation film 2, and hence the etching is easily carried out. In addition, both side surfaces 8a and 8b of the gate electrode 8 are formed in a self-aligned manner by means of the device isolation film 2.

As is evident from FIGS. 9 and 10, the gate electrode 8 is formed in such a way that both side surfaces 8a and 8b are spaced apart from the side surfaces of the opening 2a of the device isolation film 2 opposite to the side surfaces 8a and 8b. Also, as is evident from FIGS. 10 and 11, both end surfaces 8c and 8d are in contact with the side surfaces of the opening 2a of the device isolation film 2 opposite to the end surfaces 8c and 8d. For this reason, even if the gate electrode is used as a part of a mask when the pair of source/drain regions are formed, the pair of source/drain regions will not be electrically short-circuited. Although the resist layer 22 used when forming the gate electrode 8 requires an overlap (margin dimension) lb, it is unnecessary to consider a distance (the dimension lb) between the edge of the device isolation film 102 and the edge of the gate electrode 106 positioned above the device isolation film 102 which is considered in the conventional semiconductor device shown in FIG. 66, that is, it is possible to reduce the margin dimension between both end surfaces 8c and 8d of the gate electrode 8 and the device isolation film 2 to zero, whereby the device formation region of the semiconductor substrate 1 is miniaturized.

Figure 12:
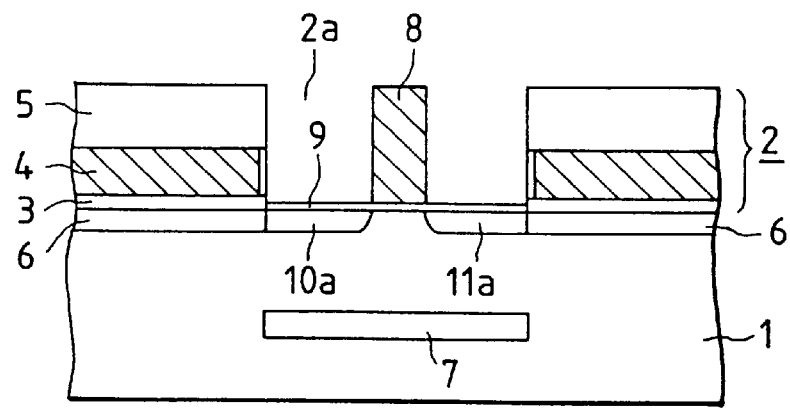
FIG. 12 is a cross-sectional view showing the principal elements of the semiconductor device arranged in sequential order of steps of a manufacturing method in the first embodiment of the present invention.

As shown in FIG. 12, impurities having the opposite conductivity type to the semiconductor substrate 1, for example, arsenic (As) in this embodiment are implanted into the semiconductor substrate at an implant energy of 20 to 50 keV using the gate electrode 8 and the device isolation film 2 as a mask. As a result of this, the low impurity concentration regions 10a and 11a, constituting the pair of source/drain regions, for example, at a dose of $10^{13}$–$10^{14}$ cm$^{-2}$ are formed in a self-aligned manner.

Figure 13:
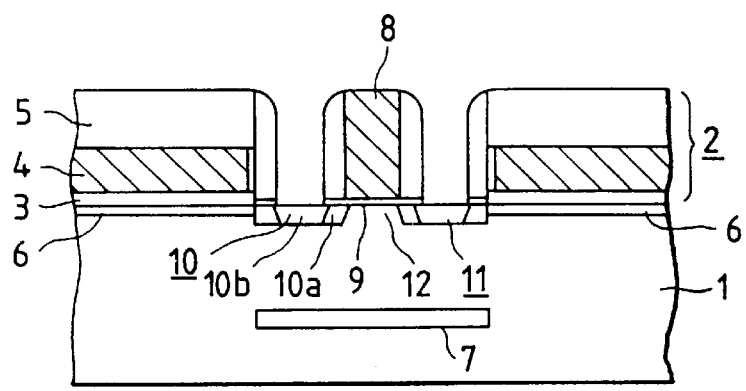
FIG. 13 is a cross-sectional view showing the principal elements of the semiconductor device arranged in sequential order of steps of a manufacturing method in the first embodiment of the present invention.

As shown in FIG. 13, an insulation film consisting of a silicon oxide film is formed, using CVD, over the entire one major surface of the semiconductor substrate 1, that is, the surface of the device isolation film 2, the side surfaces of the opening 2a, the upper surfaces of the pair of low impurity concentration regions 10a and 11a and the gate electrode 8, and both side surfaces 8a and 8b. Thereafter, the insulation film is etched by dry etching, which is anisotropic etching, until the upper surface of the gate electrode 8 is revealed.

As a result of this, the side walls (first side wall insulation films) 13, 13 are formed on both side surfaces 8a and 8b of the gate electrode 8, and the second side wall insulation film 14 is formed on the side surfaces of the opening 2a of the device isolation film 2, other than the side surfaces which are in contact with the end surfaces of the gate electrode 8. The widths of the first and second side wall insulation films 13 and 14 at a position where the side wall insulation films are in contact with the one major surface of the semiconductor substrate 1 are regulated by the thickness of the silicon oxide film formed by CVD. For example, the widths of the side wall insulation films 13 and 14 are 50 to 100 nm. In this way, the first and second side wall insulation films 13 and 14 can be formed in a self-aligned manner, it is unnecessary to assure a margin for positioning purposes required when the side wall insulation films are formed by photolithography, and hence the semiconductor device can be miniaturized.

Impurities having the opposite conductivity type to the semiconductor substrate 1, for example, arsenic (As) in this embodiment are implanted into the semiconductor substrate at an implant energy of 50 to 100 keV using the first and second side wall insulation films 13 and 14, the gate electrode 8, and the device isolation film 2 as a mask. As a result of this, the high impurity concentration regions 10b and 11b, constituting the pair of source/drain electrodes, for example, at a dose of $10^{15}$–$10^{16}$ cm$^{-2}$ are formed in a self-aligned manner. The low impurity concentration regions 10a and 11a and the high impurity concentration regions 10b and 11b are thermally diffused by a heat treatment, whereby the pair of source/drain regions 10 and 11 are formed which have the stable low impurity concentration regions 10a and 11a and the stable high impurity concentration regions 10b and 11b. An area sandwiched between the pair of source/drain regions 10 and 11 serves as the channel region 12.

Figure 14:
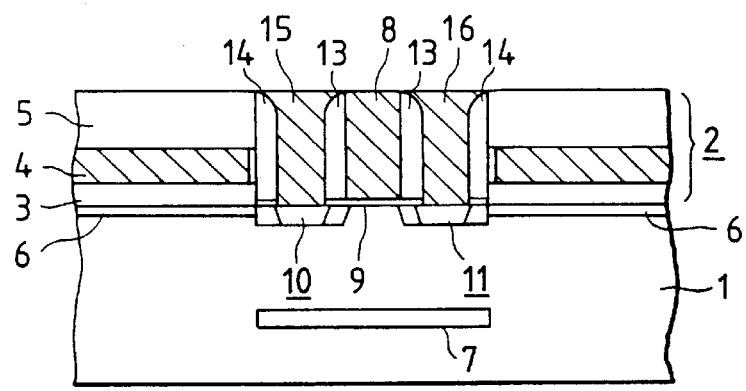
FIG. 14 is a cross-sectional view showing the principal elements of the semiconductor device arranged in sequential order of steps of a manufacturing method in the first embodiment of the present invention.
Figure 15:
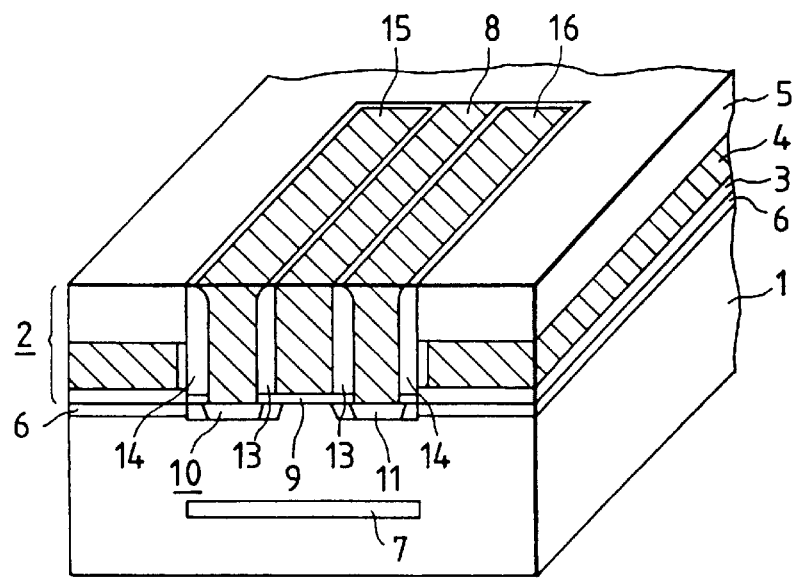
FIG. 15 is a perspective view showing the principal elements of the semiconductor device arranged in sequential order of steps of a manufacturing method in the first embodiment of the present invention.

As shown in FIG. 14, a polycrystalline silicon layer (which may be doped with impurities such as phosphorous or boron) which is used in forming the pair of source/drain electrodes 15 and 16 by CVD is formed over the whole of one major surface of the semiconductor substrate 1, i.e., formed over the device formation region, the device isolation film 2, the gate electrode 8, and the first and second side wall insulation films 13 and 14. Thereafter, the thickness of the polycrystalline silicon layer is reduced by polishing or dry etching to such an extent that the surface of the third layer 5 of the device isolation film 2 is revealed, as a result of which a buried polycrystalline silicon layer is formed only within the device formation region of the semiconductor substrate 1 surrounded by the first and second side wall insulation films 13 and 14, that is, only on the pair of source/drain regions 10 and 11.

This buried polycrystalline silicon layer becomes the pair of source/drain electrodes 15 and 16, and the thickness of the buried polycrystalline silicon layer is the same as the thickness of the device isolation film 2. The surface of the buried polycrystalline silicon layer is flush with the surface of the third layer 5, thereby resulting in a continuous smooth surface. In this way, the pair of source/drain electrodes 15 and 16 can be formed in a self-aligned manner, and hence it is unnecessary to ensure a margin for aligning purposes required when the source/drain electrodes 15 and 16 are formed by photolithography, whereby the semiconductor device can be miniaturized. In other words, it is unnecessary to consider the distance (the dimension la) between the contact hole 19a and the edge of the device isolation film 2, as contrasted with the conventional semiconductor device shown in FIG. 65, whereby the device formation region of the semiconductor substrate 1 is miniaturized.

In this way, the n-type MOS transistor, having the gate electrode 8, the pair of source/drain regions 10 and 11 and the pair of source/drain electrodes 15 and 16, is formed within the device formation region of the semiconductor substrate 1 which is surrounded by the device isolation film 2, that is, which is exposed at the opening 2a. As shown in a perspective view of FIG. 15, the upper surfaces of the gate electrode 8 and the pair of source/drain electrodes 15 and 16 are smooth and flush with the upper surface of the third layer 5 of the device isolation film 2, and also the upper surfaces are surrounded by the third layer 5 of the device isolation film 2.

Figure 16:
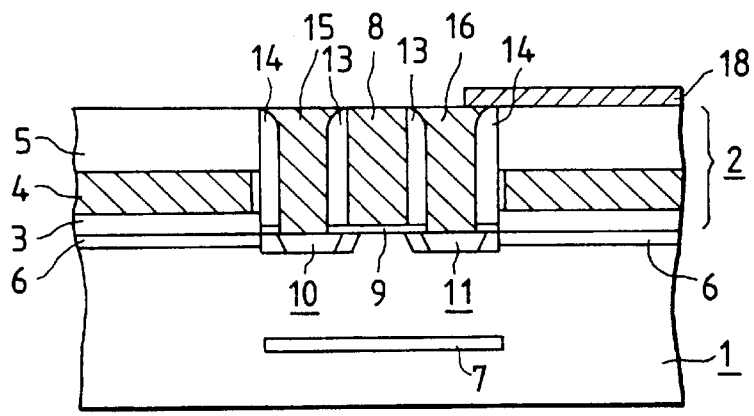
FIG. 16 is a cross-sectional view showing the principal elements of the semiconductor device arranged in sequential order of steps of a manufacturing method in the first embodiment of the present invention.

As shown in FIG. 16, a conductive material layer is formed over the whole of one major surface of the semiconductor substrate 1, i.e., it is formed over the surface of the device isolation film 2, the upper surface of the gate electrode 8, the upper surfaces of the pair of source/drain electrodes 15 and 16, and the upper surfaces of the first and second side wall insulation films 13 and 14 by sputtering or CVD. This conductive material layer has a thickness of, for example, 50 nm and is selected from the group comprising a polycrystalline layer; a metal silicide layer such as tungsten silicide, titanium silicide, cobalt silicide, tantalum silicide, molybdenum silicide, nickel silicide, or platinum silicide; a metal nitride film layer such as titanium nitride, or tantalum nitride; a metal layer such as tungsten, tantalum, molybdenum, or cobalt; a metal layer such as aluminum; or a laminated body consisting of two or more of above. A resist layer is then patterned over the conductive layer.

The conductive layer is then etched using the resist layer as a mask, so that a gate electrode wiring layer 17 electrically connected to the upper surface of the gate electrode 8, and one source/drain electrode wiring layer 18 electrically connected to the upper surface of the source/drain electrode 16 of the pair of source/drain electrodes, are formed. The conductive material layer is formed on the smooth surface, and hence the etching of this conductive material layer at this time is easily carried out with superior accuracy. Moreover, since the source/drain electrode wiring layer 18 is electrically connected to the upper surface of the source/drain electrode 16, the source/drain electrode wiring layer 18 is not electrically connected to the first impurity region 6 below the device isolation film 2. It is unnecessary to consider the distance (the dimension la) between the contact hole 19a and the edge of the device isolation film 2, as contrasted with the conventional semiconductor device shown in FIG. 65, whereby the device formation region of the semiconductor substrate 1 is miniaturized.

An interlayer insulation film 19, which consists of, for example, a silicon oxide film having a thickness of 800 nm, is formed over the whole of one major surface of the semiconductor substrate 1, i.e., it is formed over the surface of the device isolation film 2, the upper surface of the gate electrode 8, the upper surfaces of the pair of source/drain electrodes 15 and 16, the upper surfaces of the first and second side wall insulation films 13 and 14, the surface of the gate electrode wiring layer 17, and the surface of the source/drain electrode wiring layer 18 by sputtering or CVD. A contact hole 19a is formed at a position aligned with the source/drain electrode 15 of the pair of source/drain electrodes by the use of well known photolithography or dry etching technique. It only needs to expose at least a part of the source/drain electrode 15 after the contact hole 19 has been formed. It is unnecessary to consider the distance (the dimension la) between the contact hole 19a and the edge of the device isolation film 2, as contrasted with the conventional semiconductor device shown in FIG. 65, whereby the device formation region of the semiconductor substrate 1 is miniaturized.

A conductive layer, which has a thickness of, for example, 500 nm and is made of aluminum, aluminum alloy, or copper, is formed over the whole of the surface of the interlayer insulation film 19 by sputtering or CVD, and a resist layer is patterned on the conductive layer. The conductive layer is etched using the resist layer as a mask, whereby another source/drain electrode wiring layer 20 is formed to be electrically connected to the source/drain electrode 15 via the contact hole 19a of the interlayer insulation film 19. If the source/drain electrode 15 is made of polycrystalline silicon, a barrier layer consisting of a metal nitride film such as titanium nitride will be provided as a substrate layer of aluminum, aluminum alloy, or copper. If the source/drain electrode 15 is made of a metal nitride film layer, a metal layer, or a laminated body consisting of them, and particularly if the source/drain electrode 15 is made of a titanium nitride layer which is in contact with the source/drain region 10, the other source/drain electrode 15 will act as a barrier layer, and hence the substrate layer is unnecessary. Either of the electrode wiring layers 18 and 20 may be connected to the source/drain electrode, or both of the electrode wiring layers 18 and 20 may be connected to the respective pair of source/drain electrodes. The shape of the opening 2a is optional, and it is not limited to a rectangle.

In this way, the semiconductor device shown in FIGS. 1 and 2 is formed, and this semiconductor device has the following advantages:

(1) The device isolation film 2 is made of the silicon oxide film 500, the polycrystalline silicon film 400, and the silicon oxide film 330, and these films are etched one after the other using the subsequent lower film as an etching stopper. The thickness required as the insulation film can be controlled by the silicon oxide film 500 which constitutes the upper third layer 5. The thickness of the silicon oxide film of the first layer 3 which is formed on, while remaining in contact with, the one major surface of the semiconductor substrate 1 can be made considerably thin. Therefore, a time required when exposing the surface of the device formation region of the semiconductor substrate to plasma such as C or F can be reduced to the minimum. It is possible to suppress deterioration of the characteristic of the device (MOS transistor) resulting from the inclusion of impurities such as C or F into the semiconductor substrate 1.

(2) The upper surface of the gate electrode 8 is continuously smooth and flush with the surface of the third layer 5 of the device isolation film 2. Both end surfaces 8c and 8d of the gate electrode 8 are in contact with the side surfaces of the opening 2a of the device isolation film 2 opposite to the end surfaces 8c and 8d, and the gate electrode 8 is embedded in the opening 2a of the device isolation film 2. For these reasons, it is possible to reduce the area occupied by the gate electrode 8. Even if the gate electrode 8 is used as a part of a mask when forming the pair of source/drain regions, the pair of source/drain regions will not be electrically short-circuited. The margin dimension between the end surfaces 8c and 8d of the gate electrode can be reduced to zero, and the device can be highly integrated.

(3) The upper surfaces of the pair of source/drain electrodes 15 and 16 are continuously smooth and flush with the upper surface of the third layer 5 of the device isolation film 2. The pair of source/drain electrodes can be formed in a self-aligned manner, and hence an alignment margin becomes unnecessary, and hence the device can be miniaturized.

(4) The n-type MOS transistor, having the gate electrode 8, the pair of source/drain regions 10 and 11, and the pair of source/drain electrodes 15 and 16, is formed in the device formation region of the semiconductor substrate 1 which is surrounded by the device isolation film 2, that is, which is exposed at the opening 2a. Both the upper surface of the gate electrode 8 and the upper surfaces of the pair of source/drain electrodes 15 and 16 are smooth and flush with the surface of the third layer 5 of the device isolation film 2, and the upper surfaces are also surrounded by the third layer 5 of the device isolation film 2. By virtue of such a configuration, the device is suitable for high integration, and the device isolation film 2 and the MOS transistor which permit facilitated patterning of a wiring are obtained.

(5) The gate electrode wiring layer 17 and the one source/drain electrode wiring layer 18 are formed on the surface of the third layer 5 of the device isolation film 2, and the layers 17 and 18 are electrically connected to the upper surface of the gate electrode 8 and the upper surface of the one source/drain electrode 16, respectively. Accordingly, etching to form the gate electrode wiring layer 17 and the one source/drain electrode wiring layer 18 is easily carried out with superior accuracy. It is completely unnecessary to consider a distance between the source/drain electrode wiring layer 18 and the edge of the device formation region 2, and hence the device can be miniaturized.

(6) If the source/drain electrode 15 is made of a refractory metal nitride layer, a refractory metal layer, or a laminated body consisting of them, and particularly if the source/drain electrode 15 is made of a titanium nitride layer which is in contact with the source/drain region 10, the source/drain electrode 15 will act as a barrier layer with respect to the other source/drain electrode wiring layer 20 which is made of a conductive layer consisting of aluminum, aluminum alloy, or copper.

In the explanation of the manufacturing method in the first embodiment, the gate electrode 8 is made of polycrystalline silicon (which may be doped with impurities such as phosphorous or boron). However, the gate electrode 8 may be made of another conductive layer, for example, selected from the group comprising a polycrystalline layer; a metal silicide layer such as tungsten silicide, titanium silicide, cobalt silicide, tantalum silicide, molybdenum silicide, or platinum silicide; a metal nitride film layer such as titanium nitride, or tantalum nitride; a metal layer such as tungsten, tantalum, molybdenum, or cobalt; a metal layer such as aluminum; or a laminated body consisting of two or more of above.

The low impurity concentration regions 10a and 11a of the pair of source/drain regions 10 and 11 are formed by ion implantation. However, the low impurity concentration regions may be formed by diffusing phosphorous included in the first and second side wall insulation films 13 and 14 into the one major surface of the semiconductor substrate 1 by a heat treatment such as thermal diffusion, using a silicon oxide film doped with phosphorous (so-called PSG film) as the first and second side wall insulation films 13 and 14, without utilization of ion implantation.

The pair of source/drain electrodes 15 and 16 are made of polycrystalline silicon (which may be doped with impurities such as phosphorous or boron) or a titanium nitride layer. However, the pair of source/drain electrodes 15 and 16 may be made of another conductive layer, for example, selected from the group comprising a metal silicide layer such as tungsten silicide, titanium silicide, cobalt silicide, tantalum silicide, molybdenum silicide, or platinum silicide; a metal nitride film layer such as titanium nitride, or tantalum nitride; a metal layer such as tungsten, tantalum, molybdenum, or cobalt; a metal layer such as aluminum; an amorphous silicon layer, or a laminated body consisting of two or more of above.

When a conductive layer doped with phosphorous or boron (doped by mixing gas such as $PH_3$ or $B_2H_6$ when a film is made by CVD, or doped by ion implantation after a film has been formed) is used for the pair of source/drain electrodes 15 and 16, it is also possible to form the high impurity concentration regions 10b and 11b by subjecting the conducive layer to a heat treatment to thermally diffuse phosphorous or boron into the one major surface of the semiconductor substrate 1, instead of forming the high impurity concentration regions 10b and 11b of the pair of source/drain regions 10 and 11 utilizing ion implantation.

The first impurity region 6 which acts as a channel stopper region is formed by ion implantation after the device isolation film 2 has been formed. However, the first impurity region 6 may be formed prior to the formation of the device isolation film 2 according to, for example, a method disclosed on page 246 of IEDM '88.

To control a threshold voltage Vth of the MOS transistor, boron may be implanted at an implant energy of 10–30 keV at a dose of $10^{12}$–$10^{13}$ cm$^{-2}$, into the device formation region of the semiconductor substrate 1 exposed at the opening 2a of the device isolation film 2 before the formation of the gate oxide film 9 and after the formation of the device isolation film 2.

Although the semiconductor substrate 1 is a silicon substrate in the first embodiment, a silicon substrate on one major surface of which a well region is formed may be used as the semiconductor substrate 1 (in this case, for convenience sake, the well region corresponds to the semiconductor substrate), or SOI (silicon on insulator) substrate may also be used.

The above explanation was given of the n-type MOS transistor, but the same explanation also applies to a p-type MOS transistor. In this case, the conductivity type mentioned in the above embodiment should be reversed.

The third layer 5 of the device isolation film 2, and the side wall insulation films 13 and 14 are respectively made of a silicon oxide film. These films may be respectively made of a silicon nitride film. In this case, the third layer 5 and the side wall insulation films 13 and 14 respectively act as an etching stopper when the silicon oxide film constituting the interlayer insulation film 19 is etched to form the contact hole 19a. For this reason, even if the interlayer insulation film 19 is overetched when the contact hole 19a is formed, the contact hole 19a will not be electrically connected to the second layer 4 (made of polycrystalline silicon) of the device isolation film 2.

Second Embodiment

Figure 17:
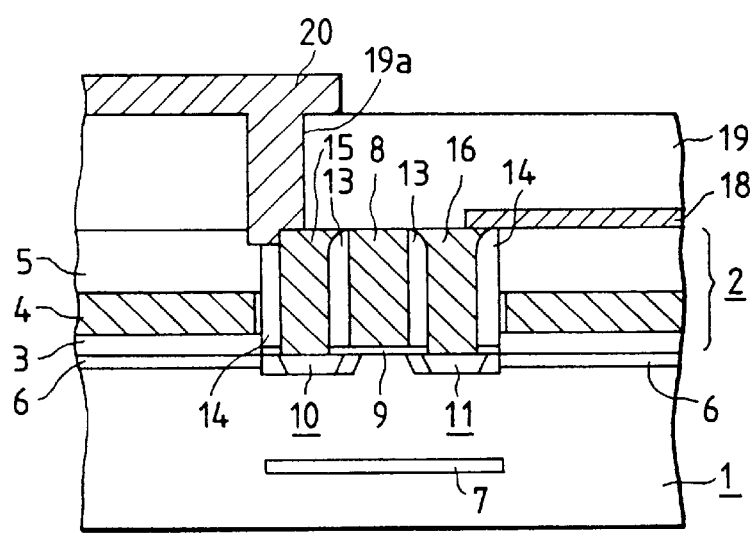
FIG. 17 is a cross-sectional view showing the principal elements of a semiconductor device in a second embodiment of the present invention.

FIG. 17 shows a semiconductor device in a second embodiment of the present invention. In the first embodiment, the source/drain electrode wiring layer 20 is electrically connected to the upper surface of only the source/drain electrode 13. In contrast to this, the second embodiment is different from the first embodiment only in that the source/drain electrode wiring layer 20 is electrically connected to the upper and side surfaces of the source/drain electrode 13.

The second embodiment is completely the same as the first embodiment until the step of forming the interlayer insulation film 19. When the contact hole 19a is formed in the interlayer insulation film 19 at a position aligned with the source/drain electrode 15, the surfaces of the third layer 5 of the device isolation film 2 and the side wall insulation film 14 are etched by, for example, 100 nm. All of the interlayer insulation film 19, the third layer 5 of the device isolation film 2, and the side wall insulation film 14 are made of a silicon oxide film. For this reason, it is also possible to etch the third layer 5 of the device isolation film 2 and the side wall insulation film 14 by overetching the interlayer insulation film 19. On the other hand, the source/drain electrode 15 is made of a material having a different etch rate compared with that of the silicon oxide film. Therefore, the source/drain electrode 15 is left unetched.

Thereafter, as with the first embodiment, a conductive layer consisting of aluminum or aluminum alloy which has a thickness of, for example, of 500 nm is formed over the whole of surface of the interlayer insulation film 19 by sputtering or CVD. A resist layer is patterned on the conductive layer. When the conductive layer is etched using the resist layer as a mask, the source/drain electrode wiring layer 20 is formed which is electrically connected to the upper surface and side surface of the source/drain electrode 15 via the contact hole 19a of the interlayer insulation film 19.

The semiconductor device having such a configuration yields the same advantages as the semiconductor device in the first embodiment. In addition, a contact area between the source/drain electrode 15 and the other source/drain electrode wiring layer 20 is increased, thereby resulting in reduced contact resistance.

Third Embodiment

Figure 18:
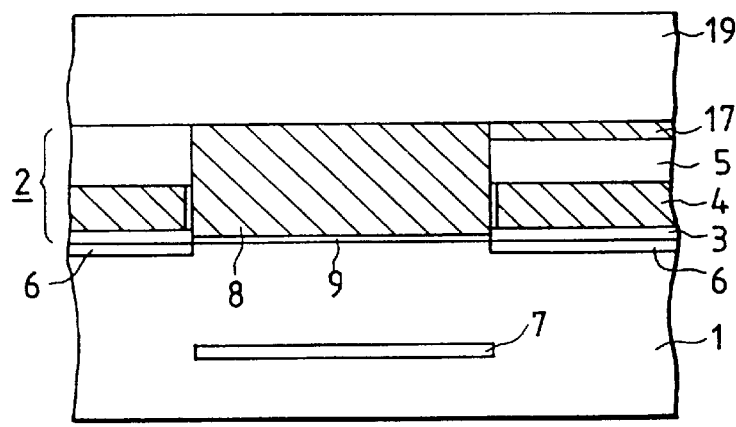
FIG. 18 is a cross-sectional view showing the principal elements of a semiconductor device in a third embodiment of the present invention.

FIG. 18 shows a semiconductor device in a third embodiment of the present invention. In the first embodiment, the gate electrode wiring layer 17 is formed on the surface of the third layer 5 of the device isolation film 2, and the gate electrode wiring layer 17 is electrically connected to the upper surface of the gate electrode 8. In contrast to this, the third embodiment is different from the first embodiment only in that the groove 5a for a gate electrode wiring layer is formed in the surface of the third layer 5 of the device isolation film 2 so as to expose a part of the end surface 8c of the gate electrode 8, and the gate electrode wiring layer 17 is embedded in the gate electrode wiring groove 5a. The gate electrode wiring layer 17 is electrically connected to the exposed surface of the end surface 8c of the gate electrode 8.

Figure 19:
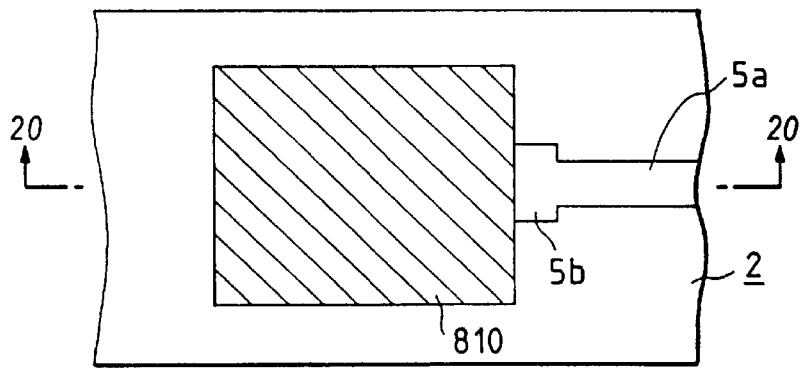
FIG. 19 is a plan view showing the principal elements of the semiconductor device arranged in sequential order of steps of a manufacturing method in the third embodiment of the present invention.
Figure 20:
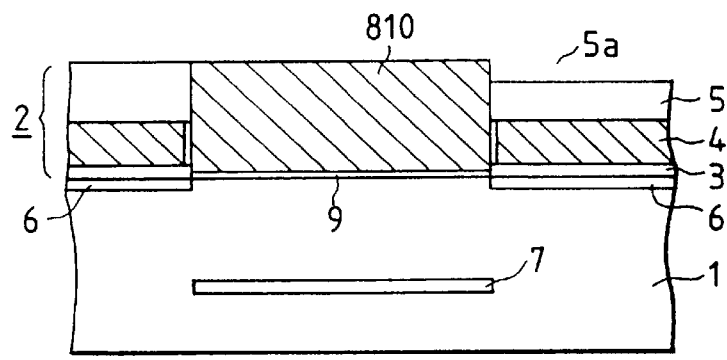
FIG. 20 is a cross-sectional view taken along line 20—20 shown in FIG. 19.

The third embodiment is completely the same as the first embodiment until the step of forming a buried polycrystalline silicon layer 810 only in the opening 2a of the device isolation film 2 shown in FIG. 7. Thereafter, as shown in FIGS. 19 and 20, the surface of the third layer 5 of the device isolation film 2, where the gate electrode wiring layer 17 is formed, is etched away by a well known photolithography or etching technique, thereby resulting in the gate electrode wiring groove 5a having a depth, for example, of 100 to 200 nm. As is evident from the drawing, to ensure electrical connection of gate electrode wiring layer to the end surface 8c of the gate electrode 8, the gate electrode wiring groove 5a has a wide portion 5b which is provided at a position where the gate electrode wiring layer is in contact with the end surface 8c of the gate electrode 8 allowing for alignment accuracy when the gate electrode 8 is formed.

Figure 21:
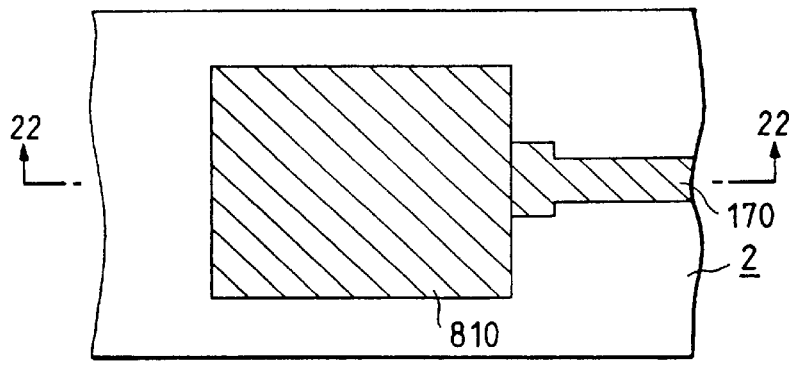
FIG. 21 is a plan view showing the principal elements of the semiconductor device arranged in sequential order of steps of a manufacturing method in the third embodiment of the present invention.
Figure 22:
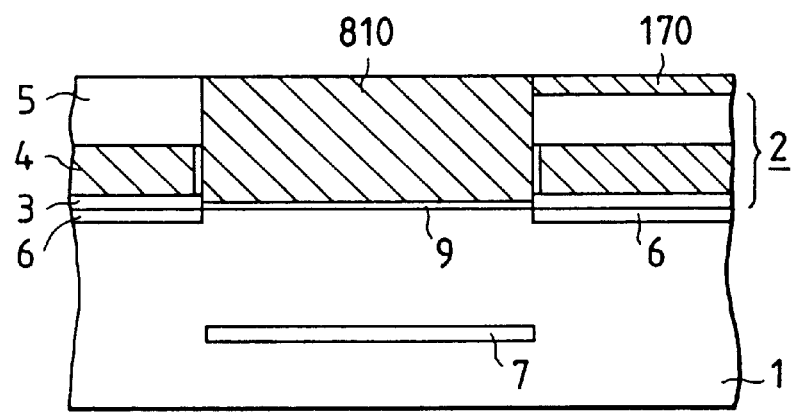
FIG. 22 is a cross-sectional view taken along line 22—22 shown in FIG. 21.

As shown in FIGS. 21 and 22, a polycrystalline silicon layer (which may be doped with impurities such as phosphorous or boron) is formed over the whole of one major surface of the semiconductor substrate 1, that is, the surface of the device isolation film 2 and the upper surface of the buried polycrystalline silicon layer 810 by sputtering or CVD. The polycrystalline silicon layer, other than the polycrystalline silicon layer remaining in the gate electrode wiring groove 5a, is removed by etch back or polishing, whereby a polycrystalline silicon layer for a gate electrode 170 is formed which is electrically connected to the end surface of the polycrystalline silicon layer 810.

Figure 23:
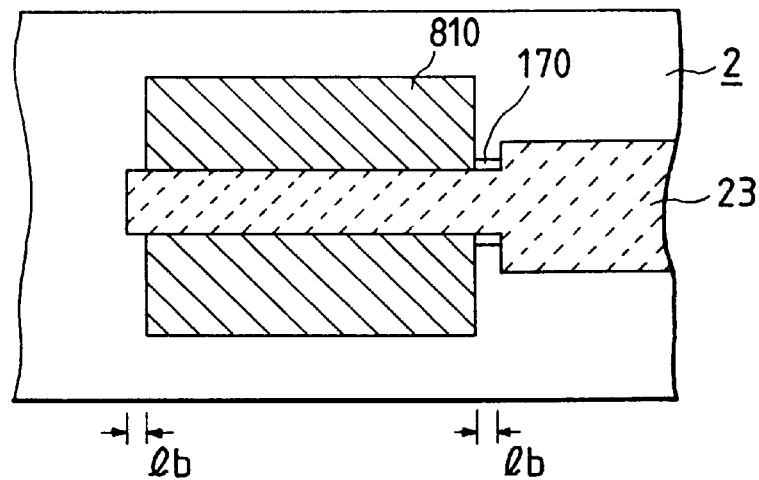
FIG. 23 is a plan view showing the principal elements of the semiconductor device arranged in sequential order of steps of a manufacturing method in the third embodiment of the present invention.
Figure 24:
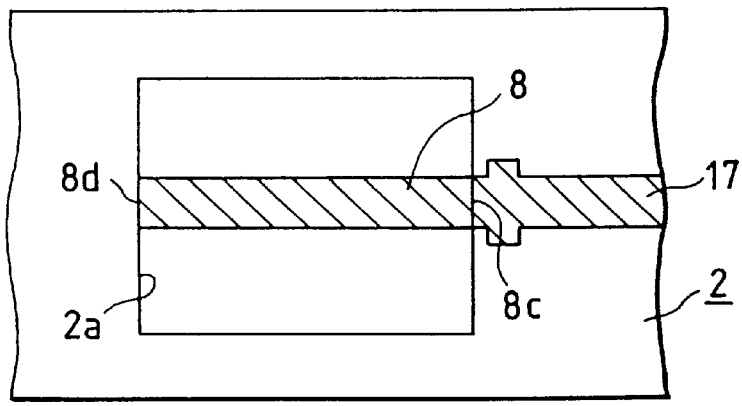
FIG. 24 is a plan view showing the principal elements of the semiconductor device arranged in sequential order of steps of a manufacturing method in the third embodiment of the present invention.

As shown in FIG. 23, a resist layer 23 is formed by the use of well known photolithography or etching technique to ensure areas where the gate electrode 8 and the gate electrode wiring layer 17 are positioned. Allowing for alignment accuracy, the resist layer 23 has overlap margins lb in the vicinity of both end surfaces of the polycrystalline silicon layer 810 with respect to the gate electrode 8. The resist layer 23 is wider than the width of the embedded gate electrode wiring conductive layer 170 at a position where the gate electrode wiring layer 17 is situated. The buried polycrystalline silicon layer 810 is etched by a well known etching technique using the resist layer 23 as a mask, so that the gate electrode 8 and the gate electrode wiring layer 17 are formed as shown in FIG. 24. The etching of the polycrystalline silicon layer 810 carried out at this time includes only the etching of the polycrystalline silicon layer 810. The thickness of the polycrystalline silicon layer 810 is set to a constant value determined by the thickness of the device isolation film 2, which facilitates the etching. Moreover, the end surfaces 8c and 8d of the gate electrode 8 are formed in a self-aligned manner by the device isolation film 2.

The gate electrode wiring layer 17 is made of the same material as the gate electrode 8. As shown in FIG. 24, a contact area between the gate electrode wiring layer 17 and the end surface 8c of the gate electrode 8 is partially etched. However, since the contact area is made wider, no problems arise from such partial etching of the contact area. Further, the thus formed gate electrode yields the same advantageous result as in the first embodiment.

In the same manner as in the first embodiment, as shown in FIGS. 12 through 18, the following items are formed in that order.

Specifically, the low impurity concentration regions 10a and 11a, constituting the pair of source/drain regions, are formed in a self-aligned manner using the gate electrode 8 and the device isolation film 2 as a mask.

The side walls (first side wall insulation films) 13, 13 are formed on both side surfaces 8a and 8b of the gate electrode 8, and the second side wall insulation film 14 is formed on the side surfaces of the opening 2a of the device isolation film 2, other than portions of the side surfaces being in contact with the both end surfaces 8c and 8d of the gate electrode 8.

The high impurity concentration regions 10b and 11b, constituting the pair of source/drain regions, are formed in a self-aligned manner using the first and second side wall insulation films 13 and 14, the gate electrode 8, and the device isolation film 2 as a mask. The low impurity concentration regions 10a and 11a, and the high impurity concentration regions 10b and 11b are thermally diffused by a heat treatment, whereby the pair of source/drain regions 10 and 11 are formed which have the stable low impurity concentration regions 10a and 11a and the stable high impurity concentration regions 10b and 11b.

The pair of source/drain electrodes 15 and 16 are formed only in the device formation region of the semiconductor substrate 1 surrounded by the first and second side wall insulation films 13 and 14, that is, they are formed only on the pair of source/drain regions 10 and 11.

The one source/drain electrode wiring layer 18, which is electrically connected to the upper surface of the one source/drain electrode 16 of the pair of source/drain electrodes, is formed on the surface of the third layer 5 of the device isolation film 2.

The interlayer insulation film 19 is formed, and the contact hole 19a is formed in the interlayer insulation film 19 at a position aligned with the other source/drain electrode 15 of the pair of source/drain electrodes.

The other source/drain electrode wiring layer 20 is formed which is electrically connected to the source/drain electrode 15 via the contact hole 19a of the interlayer insulation film 19.

Figure 25:
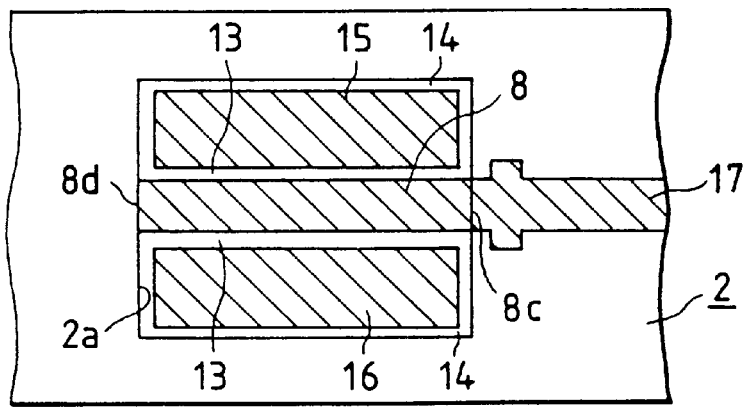
FIG. 25 is a plan view showing the principal elements of the semiconductor device arranged in sequential order of steps of a manufacturing method in the third embodiment of the present invention.

In this way, the semiconductor device shown in FIG. 18 is formed. This semiconductor device yields the same result as in the first embodiment. The device is arranged in such a way that the gate electrode wiring layer 17 is electrically connected to the end surface of the gate electrode 8. With this configuration, as shown in FIG. 25, the side wall insulation film 14 is inevitably interposed between the end surface of the gate electrode wiring layer 17 and the end surfaces of the pair of source/drain electrodes 15 and 16. Hence, even if an alignment error arises when the gate electrode wiring groove 5a and the gate electrode 8 are formed, the gate electrode wiring layer 17 and the pair of source/drain electrodes 15 and 16 will not be electrically short-circuited.

Fourth Embodiment

Figure 26:
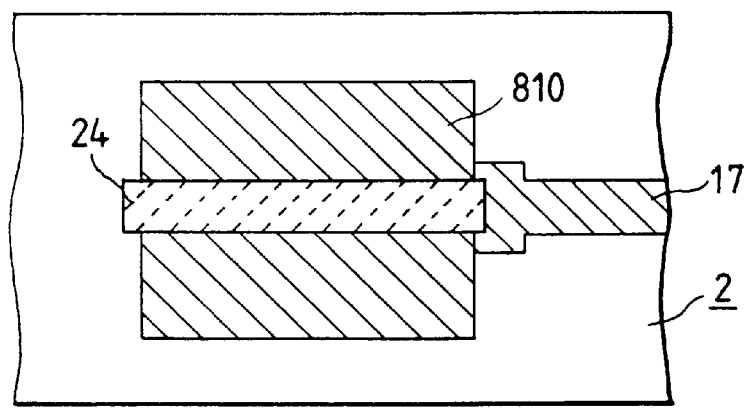
FIG. 26 is a plan view showing the principal elements of a semiconductor device arranged in sequential order of steps of a manufacturing method in a fourth embodiment of the present invention.
Figure 27:
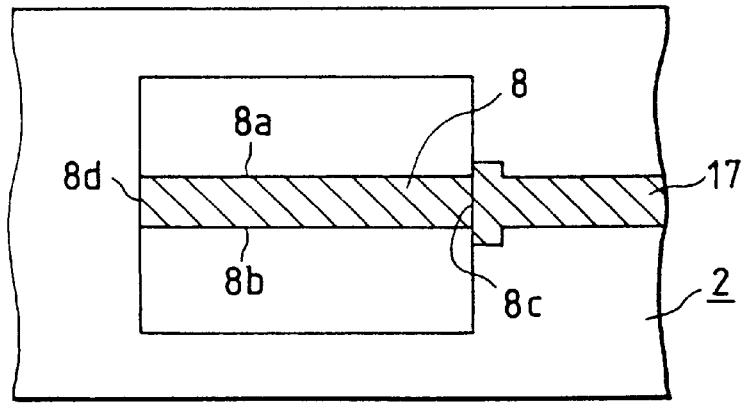
FIG. 27 is a plan view showing the principal elements of the semiconductor device arranged in sequential order of steps of a manufacturing method in the fourth embodiment of the present invention.

FIGS. 26 and 27 show a semiconductor device in a fourth embodiment of the present invention. In the third embodiment, the gate electrode wiring layer 17 and the gate electrode 8 are made of the same material. In contrast to this embodiment, the gate electrode wiring layer 17 and the gate electrode 8 are made of respectively different materials in the fourth embodiment. The fourth embodiment is the same as the third embodiment in other points.

For example, two different conducive material layers may be selected, respectively as the gate electrode 8 and the gate electrode wiring layer 17, from the group comprising a metal silicide layer such as tungsten silicide, titanium silicide, cobalt silicide, tantalum silicide, molybdenum silicide, or platinum silicide; a metal nitride film layer such as titanium nitride, or tantalum nitride; a metal layer such as tungsten, tantalum, molybdenum, or cobalt; a metal layer such as aluminum; an amorphous silicon layer, or a laminated body consisting of two or more of above.

The fourth embodiment is different from the third embodiment only in the steps of the formation of the gate electrode 8, i.e., the step shown in FIG. 26 (the step of the third embodiment shown in FIG. 23) and the step shown in FIG. 27 (the step of the third embodiment shown in FIG. 24).

In more detail, as shown in FIG. 26, the gate electrode wiring layer 17 consisting of, for example, cobalt silicide is embedded in the gate electrode wiring groove 5a so as to be electrically connected to the end surface of the polycrystalline silicon layer 810. Thereafter, the resist layer 24 is formed using well known photolithography or etching technique to ensure an area where the gate electrode is situated. This resist layer 24 is formed so as to have an overlap margin in the vicinity of each end surface of the polycrystalline silicon layer 810 in relation to the gate electrode allowing for alignment accuracy. The buried polycrystalline silicon layer 810 is etched with $Cl_2$ or $BCl_3$ by means of well known etching technique using the resist layer 23 as a mask, so that the gate electrode 8 is formed as shown in FIG. 27. The etching of the polycrystalline silicon layer 810 carried out at this time includes only the etching of the polycrystalline silicon layer 810. The gate electrode wiring layer 17 is not etched depending on etching gas. Hence, in such a case, it is unnecessary to cover the gate electrode wiring layer 17 with the resist layer 24 as shown in FIG. 26. Moreover, the thickness of the polycrystalline silicon layer 810 is set to a constant value determined by the thickness of the device isolation film 2, which facilitates the etching. Further, the side surfaces 8a and 8b of the gate electrode 8 are formed in a self-aligned manner by the device isolation film 2.

After the above steps, the semiconductor device is manufactured in the same manner as in the third embodiment. The device manufactured in this way also yields the same advantageous results as the third embodiment.

Fifth Embodiment

Figure 28:
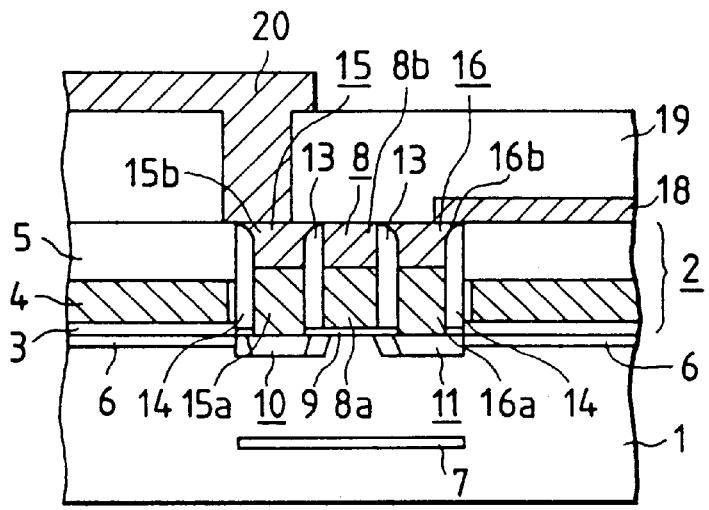
FIG. 28 is a cross-sectional view showing the principal elements of a semiconductor device in a fifth embodiment of the present invention.

FIG. 28 shows a semiconductor device in a fifth embodiment of the present invention. The semiconductor device in the fifth embodiment is different from that in the first embodiment only in that the gate electrode 8 and the pair of source/drain electrodes 15 and 16 are respectively made of lower layers 8a, 15a, and 16a, and upper layers 8b, 15b, and 16b which are respectively laid on the lower layers while remaining in contact with them. The lower layers 8a, 15a, and 16a are made of polycrystalline silicon layers (which may be doped with impurities such as phosphorous or boron), and the upper layers 8b, 15b, and 16b are made of metal silicide such as titanium silicide, tungsten silicide, or cobalt silicide.

The method of manufacturing the semiconductor device in this embodiment is the same as that in the first embodiment until the step shown in FIG. 14. In more detail, the manufacturing method is the same until a polycrystalline silicon layer used for forming the gate electrode 8 and the pair of source/drain electrodes 15 and 16 is formed within the device formation region of the semiconductor substrate 1 which is surrounded by the device isolation film 2, i.e., which is exposed at the opening 2a.

Figure 29:
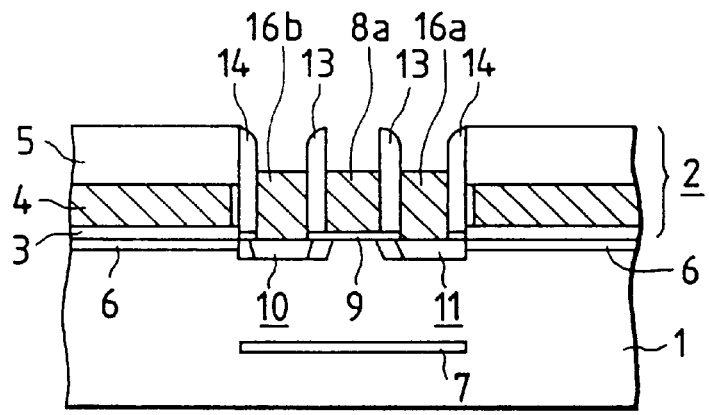
FIG. 29 is a cross-sectional view showing the principal elements of the semiconductor device arranged in sequential order of steps of a manufacturing method in the fifth embodiment of the present invention.

Thereafter, as shown in FIG. 29, the upper surfaces of the polycrystalline silicon layer for the gate electrode 8 and the polycrystalline silicon layer for the pair of source/drain electrodes 15 and 16 are etched by, for example, 100–200 nm using $Cl_2$ or $SF_6$ as etching gas. As a result of this, the lower layers 8a, 15a, and 16a of the gate electrode 8 and the pair of source/drain electrodes 15 and 16 are respectively formed from the polycrystalline silicon layer. At this time, the third layer 5 of the device isolation film 2 and the side wall insulation films 13 and 14 are made of an insulation film such as a silicon oxide film having a different etch rate compared with the polycrystalline silicon, and therefore they are not etched. Eventually, the upper surface of the polycrystalline silicon layer for the gate electrode 8 and the upper surface of the polycrystalline silicon layer for the pair of source/drain electrodes 15 and 16 are recessed in such a way as to be surrounded by the side wall insulation films 13 and 14.

Figure 30:
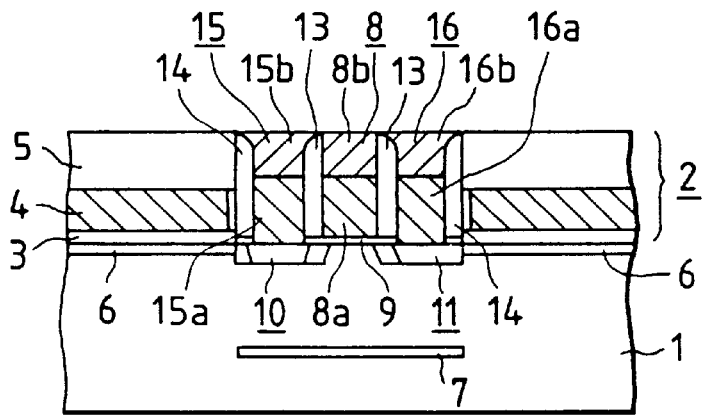
FIG. 30 is a cross-sectional view showing the principal elements of the semiconductor device arranged in sequential order of steps of a manufacturing method in the fifth embodiment of the present invention.

As shown in FIG. 30, a metal silicide layer such as titanium silicide, tungsten silicide, or cobalt silicide is formed on the whole of one major surface of the semiconductor substrate 1, that is, over the surface of the third layer 5 of the device isolation film 2, the upper surfaces of the lower layers 8a, 15a, and 16a of the gate electrode 8 and the pair of source/drain electrodes 15 and 16, and the surfaces of the side wall insulation films 13 and 14 by CVD. Then, the metal silicide is removed to such an extent that the surface of the third layer 5 of the device isolation film 2 and the leading ends of the side wall insulation films 13 and 14 are exposed by etch back or polishing. As a result of this, the upper layers 8b, 15b, and 16b consisting of buried metal silicide are formed on the lower layers 8a, 15a, and 16a of the gate electrode 8 and the pair of source/drain electrodes 15 and 16 within the recesses defined by the side wall insulation films 13 and 14.

In this way, the n-type MOS transistor, having the gate electrode 8, the pair of source/drain regions 10 and 11, and the pair of source/drain electrodes 15 and 16, is formed in the device formation region of the semiconductor substrate 1 which is surrounded by the device isolation film 2, that is, which is exposed at the opening 2a. Both the upper surface of the gate electrode 8 and the upper surfaces of the pair of source/drain electrodes 15 and 16 are smooth and flush with the surface of the third layer 5 of the device isolation film 2, and the upper surfaces are also completely surrounded by the third layer 5 of the device isolation film 2.

Thereafter, the gate electrode wiring layer 17, the pair of source/drain electrode wiring layers 18 and 20, and the interlayer insulation film 19 are formed in the same manner as in the previously mentioned first embodiment, whereby the semiconductor device shown in FIG. 28 is obtained. The semiconductor device having such a configuration also yields the same advantageous results as the semiconductor device in the first embodiment.

In the fifth embodiment, the gate electrode 8 and the pair of source/drain electrodes 15 and 16 are respectively made up of the combination of two layers, that is, the lower layers 8a, 15a, and 16a and the upper layers 8b, 15b, and 16b.

However, only either the gate electrode 8 or the pair of source/drain electrodes 15 and 16 may be made up of the combination of an upper layer and a lower layer.

Sixth Embodiment

Figure 31:
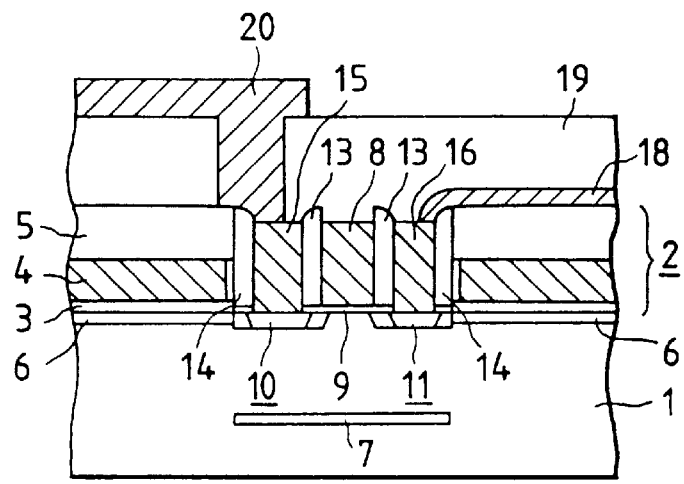
FIG. 31 is a cross-sectional view showing the principal elements of a semiconductor device in a sixth embodiment of the present invention.

FIG. 31 shows a semiconductor device in a sixth embodiment of the present invention. In contrast to the first embodiment, the sixth embodiment is different in that the upper surface of the gate electrode 8 and the upper surfaces of the pair of source/drain electrodes 15 and 16 are positioned at a different height compared with the surface of the third layer 5 of the device isolation film 2, that is, the upper surfaces are positioned lower than the surface of the third layer 5 of the device isolation film 2. The sixth embodiment is the same as the first embodiment in all other respects.

The method of manufacturing the semiconductor device in this embodiment is the same as that in the first embodiment until the step shown in FIG. 14. In more detail, the manufacturing method is the same until a polycrystalline silicon layer, used for forming the gate electrode 8 and the pair of source/drain electrodes 15 and 16, is formed within the device formation region of the semiconductor substrate 1 which is surrounded by the device isolation film 2, i.e., which is exposed at the opening 2a.

Figure 32:
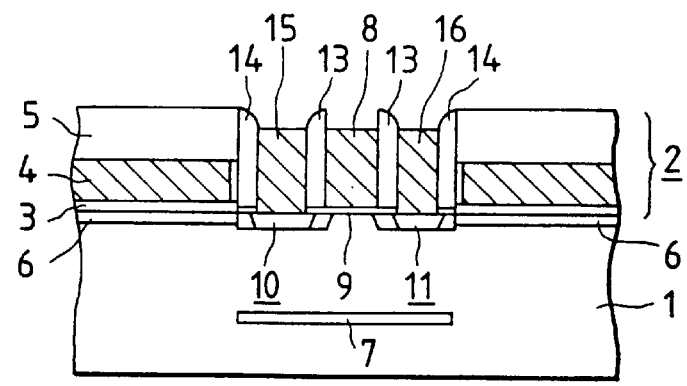
FIG. 32 is a cross-sectional view showing the principal elements of the semiconductor device arranged in sequential order of steps of a manufacturing method in the sixth embodiment of the present invention.

Subsequently, as shown in FIG. 32, the upper surface of the polycrystalline silicon layer for the gate electrode 8 and the upper layer of the polycrystalline silicon layer for the pair of source/drain electrodes 15 and 16 are etched to the depth which is the same as, for example, the width of the side wall insulation films 13 and 14 at an interface where the insulation films are in contact with the one major surface of the semiconductor substrate 1. As a result of this, the gate electrode 8, and the pair of source/drain electrodes 15 and 16 are formed.

The third layer 5 of the device isolation film 2 and the side wall insulation films 13 and 14 remain unetched at this time. The upper surfaces of the gate electrode 8 and the pair of source/drain electrodes 15 and 16 are positioned lower than the narrow leading ends of the side wall insulation films 13 and 14. Therefore, the gate electrode 8 is reliably insulated from the pair of source/drain electrodes 15 and 16 by means of wider portions of the side wall insulation films 13 and 14.

Similarly to the first embodiment, the gate electrode wiring layer 17, the pair of source/drain electrode wiring layers 18 and 20, and the interlayer insulation film 19 are formed, whereby a semiconductor device shown in FIG. 31 is obtained. The semiconductor device having such a configuration yields the same advantageous results as the device in the first embodiment. In addition, the gate electrode 8 is reliably insulated from the pair of source/drain electrodes 15 and 16.

In the sixth embodiment, the gate electrode 8 and the pair of source/drain electrodes 15 and 16 are made of the same material. However, if the gate electrode 8 is made of polycrystalline silicon, the pair of source/drain electrodes 15 and 16 are made of cobalt silicide, and they are etched by $Cl_2$ gas, only the gate electrode 8 will be etched. However, the gate electrode 8 is reliably insulated from the pair of source/drain electrodes 15 and 16 by means of wider portions of the side wall insulation films 13 and 14. In other words, the gate electrode 8 and the pair of source/drain electrodes 15 and 16 are made of respectively different materials, and either of them is etched; namely, the upper surface of the gate electrode 8 and the upper surfaces of the pair of source/drain electrodes 15 and 16 are different in height from each other, thereby resulting in similar advantageous results.

Seventh Embodiment

Figure 33:
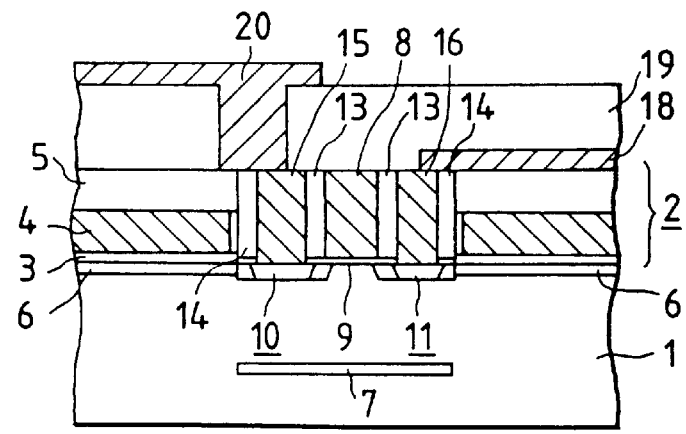
FIG. 33 is a cross-sectional view showing the principal elements of a semiconductor device in a seventh embodiment of the present invention.

FIG. 33 shows a semiconductor device in a seventh embodiment. In contrast to the sixth embodiment, the seventh embodiment is different in that the surface of the third layer 5 of the device isolation film 2 and the narrow leading ends of the side wall insulation films 13 and 14 are etched after upper portions of the gate electrode 8 and the pair of source/drain electrodes 15 and 16 have been etched. The seventh embodiment is the same as the sixth embodiment in all other respects.

Even in this seventh embodiment, the method of manufacturing the semiconductor device in this embodiment is the same as that in the sixth embodiment until the step shown in FIG. 32. In more detail, the manufacturing method is completely the same until upper portions of a polycrystalline silicon layer for the gate electrode 8 and a polycrystalline silicon layer for the pair of source/drain electrodes 15 and 16 are etched to form the gate electrode 8 and the pair of source/drain electrodes 15 and 16.

Figure 34:
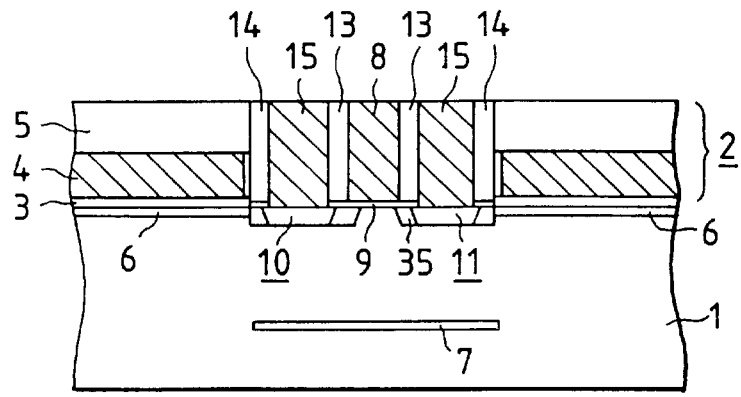
FIG. 34 is a cross-sectional view showing the principal elements of the semiconductor device arranged in sequential order of steps of a manufacturing method in the seventh embodiment of the present invention.

Subsequently, as shown in FIG. 34, the surface of the third layer 5 of the device isolation film 2 and the leading ends of the side wall insulation films 13 and 14 are etched so as to be flush with the upper surfaces of the gate electrode 8 and the pair of source/drain electrodes 15 and 16. The surface of the third layer 5 of the device isolation film 2 and the upper surfaces of the side wall insulation films 13 and 14 are flush with the upper surfaces of the gate electrode 8 and the pair of source/drain electrodes 15 and 16. This renders patterning, used when the gate electrode wiring layer 17 and the one source/drain electrode wiring layer 18 are formed, facilitated.

In the same manner as in the sixth embodiment, the gate electrode wiring layer 17, the pair of source/drain electrode wiring layers 18 and 20, and the interlayer insulation film 19 are formed, whereby the semiconductor device shown in FIG. 33 is obtained. The semiconductor device having such a configuration yields the same results as the device in the third embodiment.

Eighth Embodiment

Figure 35:
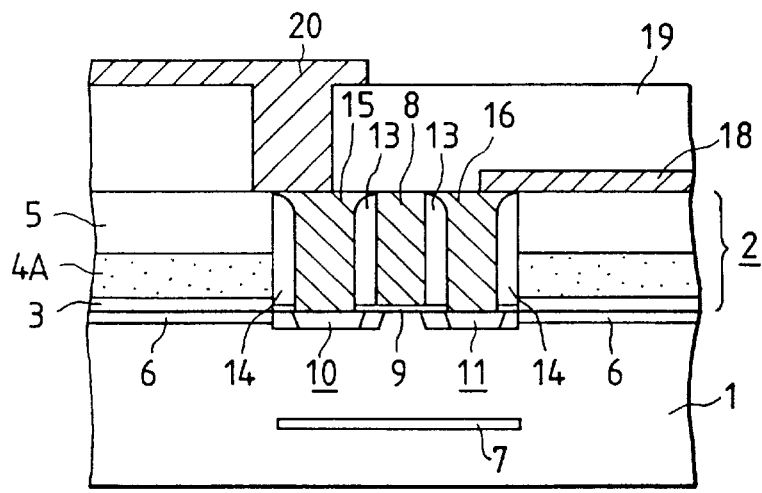
FIG. 35 is a cross-sectional view showing the principal elements of a semiconductor device in an eighth embodiment of the present invention.

FIG. 35 shows a semiconductor device in an eighth embodiment of the present invention. In the first embodiment, the second layer 4 of the device isolation film 2 is made of a polycrystalline silicon film and a silicon oxide film formed on side surfaces of the polycrystalline silicon film. In contrast to this, the eighth embodiment is different from the first embodiment only in that the second layer 4A of the device isolation film 2 is made of an insulation film differing from an insulation film of the first layer 3 and the third layer 5. For example, the first layer 3 and the third layer 5 are made of a silicon oxide film, and the second layer 4A is made of a silicon nitride film. The eighth embodiment is the same as the first embodiment in all other respects.

Figure 36:
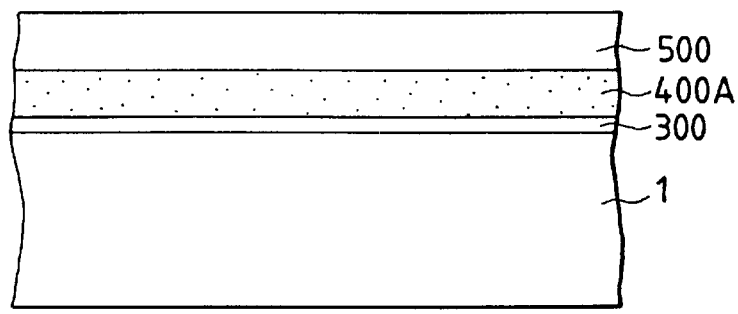
FIG. 36 is a cross-sectional view showing the principal elements of the semiconductor device arranged in sequential order of steps of a manufacturing method in the eighth embodiment of the present invention.

In a method for manufacturing the semiconductor device of the eight embodiment, a silicon oxide film 300 having a thickness of, for example, 20 nm is first formed over one major surface of a semiconductor substrate 1 by thermal oxidation or CVD, as shown in FIG. 36. Then, a silicon nitride film 400A having a thickness of, for example, 100 nm is formed on the surface of the silicon oxide film 300 by CVD. Further, a silicon oxide film 500 having a thickness of, for example, 400 nm is formed on the surface of the silicon nitride film 400A by CVD.

Figure 37:
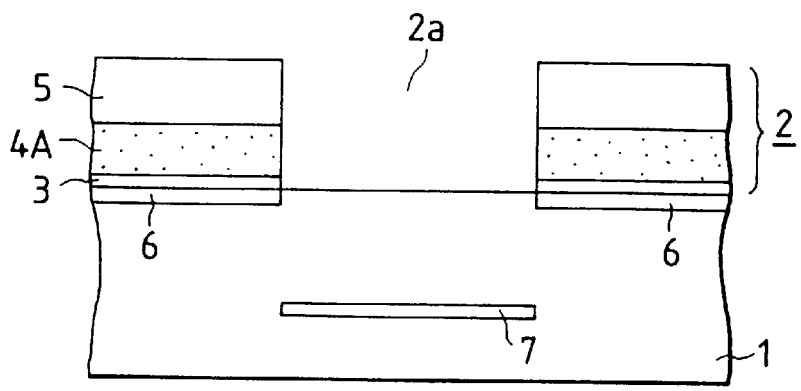
FIG. 37 is a cross-sectional view showing the principal elements of the semiconductor device arranged in sequential order of steps of a manufacturing method in the eighth embodiment of the present invention.

As shown in FIG. 37, a resist is formed on the surface of the silicon oxide film 500, and the resist has an opening which is rectangular as viewed from above and is aligned with the device formation region. The silicon oxide film 500 is etched by etching gas consisting of, for example, a mixture of $CF_4$ and $H_2$ (the partial pressure of $H_2$ is adjusted so that the etch rate will increase with respect to the silicon oxide film) using the resist layer as a mask, and also using the silicon nitride film 400A as an etching stopper. Then, the silicon nitride film 400A is etched by etching gas consisting of, for example, a mixture of $CF_4$ and $H_2$ (the partial pressure of $H_2$ is adjusted so that the etch rate will increase with respect to the silicon nitride film) using the silicon oxide film 300 as an etching stopper. Finally, the silicon oxide film 300 is etched by etching gas consisting of a mixture of, for example, $CF_4$ and $H_2$ (here, the partial pressure of $H_2$ is adjusted so that the etch rate can increase with respect to the silicon oxide film). As a result of this, the device isolation film 2 is formed which is made up of the first layer 3, the second layer 4A, and the third layer 5, each having opening 2a aligned with the device formation region of the semiconductor substrate 1.

Allowing for evenness of the etch rate, 10% overetching is usually carried out when the silicon oxide film 500, the silicon nitride film 400A, and the silicon oxide film 300 are etched. In the eighth embodiment, the silicon nitride film 400A having a different etch rate compared with the first layer 3 is interposed in the device isolation film 2, and hence it is possible to reduce the thickness of the first layer 3 of the silicon oxide film which is formed on, and while remaining in contact with, the one major surface of the semiconductor substrate 1 to as thin as, for example, 20 nm. This is the same thickness as obtained in the first embodiment by virtue of the silicon nitride film 400A. Eventually, it is possible to reduce the amount of overetching of the silicon oxide film 300 when the first layer 3 is formed, and it is also possible to reduce the time during which the surface of the device formation region of the semiconductor substrate is exposed to plasma, such as C or F, to the minimum. Hence, it is possible to prevent the inclusion of impurities of C or F into the semiconductor substrate 1, thereby resulting in a device (MOS transistor), whose characteristics are not so deteriorated, being in the device formation region.

Even in the eighth embodiment, as with the first embodiment, it is possible to reduce the thickness of the silicon oxide film of the first layer 3 to as thin as, for example, 20 nm. Hence, the remaining silicon oxide film having a height of several nanometers resulting from unevenness of the etch rate can also be removed by a solution of diluted HF, without carrying out overetching. In this case, it is possible to form the opening 3a of the first layer 3 with even less damage.

Impurities having the same conductivity type as the semiconductor substrate 1, for example, p-type impurities such as boron, are implanted into the semiconductor substrate at an implant energy of several hundred keV at a dose of $10^{12}$–$10^{13}$ cm$^{-2}$. As a result of this, the first impurity region 6, having a higher impurity concentration compared with the semiconductor substrate 1 which acts as a channel stopper, is formed, in a self-aligned manner with respect to the device isolation film 2, on the surface of the device isolation region of the semiconductor substrate 1, that is, the surface directly below the device isolation film 2. Moreover, the second impurity region 7 having a higher impurity concentration compared with the semiconductor substrate 1 is formed at a predetermined depth from the surface of the device formation region of the semiconductor substrate 1, for example, at a depth of several hundred nanometers.

Similar to the first embodiment, a semiconductor device shown in FIG. 35 is manufactured in the same manner as the semiconductor devices shown in FIGS. 6 through 17. The semiconductor device having such a configuration yields the same advantageous results as are provided by the semiconductor device in the first embodiment.

Ninth Embodiment

Figure 38:
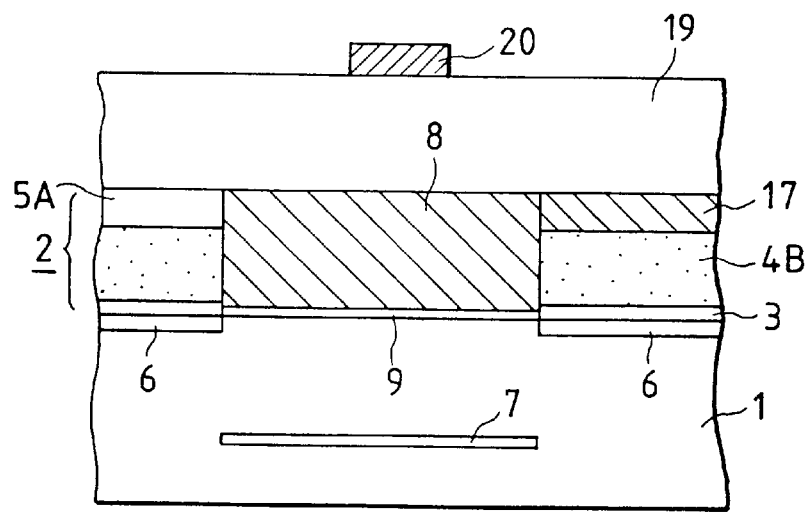
FIG. 38 is a cross-sectional view showing the principal elements of a semiconductor device in a ninth embodiment of the present invention.

FIG. 38 shows a semiconductor device in a ninth embodiment of the present invention. In the semiconductor device of the eight embodiment, the gate electrode wiring layer 17 is formed on the surface of the third layer 5 of the device isolation film 2 so as to be electrically connected to the upper surface of the gate electrode 8. In contrast to the eight embodiment, a semiconductor device in this embodiment is different from the semiconductor device of the eight embodiment only in that the groove 5c for a gate electrode wiring is formed in the third layer 5 of the device isolation film 2 so as to expose a part of the end surface 8c of the gate electrode 8, and the gate electrode wiring layer 17 is embedded in this gate electrode wiring layer groove 5c. The gate electrode wiring layer 17 is electrically connected to an exposed surface of the end surface 8c of the gate electrode 8. The ninth embodiment is the same as the eighth embodiment in all other respects.

Figure 39:
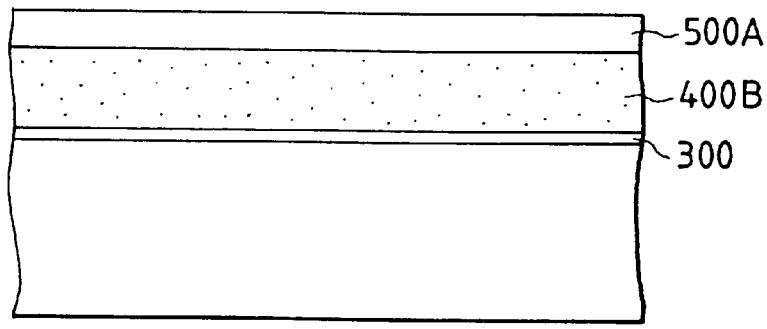
FIG. 39 is a cross-sectional view showing the principal elements of the semiconductor device arranged in sequential order of steps of a manufacturing method in the ninth embodiment of the present invention.

A method of manufacturing the semiconductor device of the ninth embodiment will now be described. As shown in FIG. 39, a silicon oxide film 300 having a thickness of, for example, 20 nm is first formed over one major surface of a semiconductor substrate 1 by thermal oxidation or CVD. Then, a silicon nitride film 400B having a thickness of, for example, 300 nm is formed on the surface of the silicon oxide film 300 by CVD. Further, a silicon oxide film 500A having a thickness of, for example, 100 nm is formed on the surface of the silicon nitride film 400B by CVD.

Figure 40:
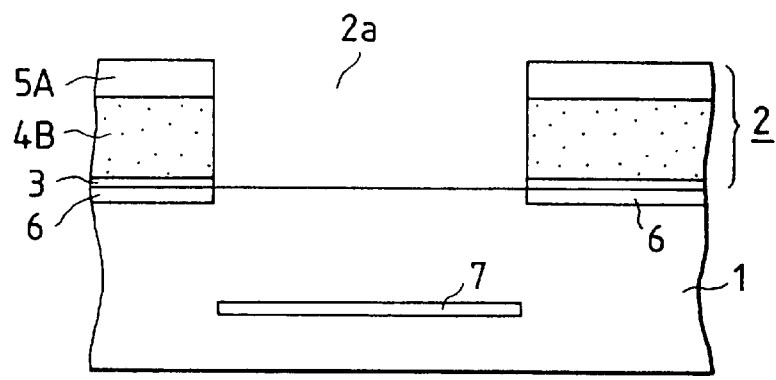
FIG. 40 is a cross-sectional view showing the principal elements of the semiconductor device arranged in sequential order of steps of a manufacturing method in the ninth embodiment of the present invention.

As shown in FIG. 40, a resist is formed on the surface of the silicon oxide film 500A, and the resist has an opening which is rectangular as viewed from above and is aligned with the device formation region. The silicon oxide film 500A is etched by etching gas consisting of, for example, a mixture of $CF_4$ and $H_2$ (the partial pressure of $H_2$ is adjusted so that the etch rate will increase with respect to the silicon oxide film) using the resist layer as a mask, and also using the silicon nitride film 400B as an etching stopper. Then, the silicon nitride film 400B is etched by etching gas consisting of, for example, a mixture of $CF_4$ and $H_2$ (the partial pressure of $H_2$ is adjusted so that the etch rate will increase with respect to the silicon nitride film) using the silicon oxide film 300 as an etching stopper. Finally, the silicon oxide film 300 is etched by etching gas consisting of a mixture of, for example, $CF_4$ and $H_2$ (here, the partial pressure of $H_2$ is adjusted so that the etch rate can increase with respect to the silicon oxide film). As a result of this, the device isolation film 2 is formed which is made up of the first layer 3, the second layer 4B, and the third layer 5A, each having opening 2a aligned with the device formation region of the semiconductor substrate 1.

Allowing for evenness of the etch rate, 10% overetching is usually carried out when the silicon oxide film 500A, the silicon nitride film 400B, and the silicon oxide film 300 are etched. In the ninth embodiment, similar to the eighth embodiment, a device (MOS transistor), whose characteristics are not so deteriorated, is formed in the device formation region.

Even in the ninth embodiment, as with the eighth embodiment, it is possible to remove the remaining silicon oxide film having a height of several nanometers resulting from unevenness of the etch rate by a solution of diluted HF, without carrying out overetching. In this case, it is possible to form the opening 3a of the first layer 3 with even less damage.

Impurities having the same conductivity type as the semiconductor substrate 1, for example, p-type impurities such as boron, are implanted into the semiconductor substrate at an implant energy of several hundred keV at a dose of $10^{12}$–$10^{13}$ cm$^{-2}$. As a result of this, the first impurity region 6, having a higher impurity concentration compared with the semiconductor substrate 1 which acts as a channel stopper, is formed, in a self-aligned manner with respect to the device isolation film 2, on the surface of the device isolation region of the semiconductor substrate 1, that is, the surface directly below the device isolation film 2. Moreover, the second impurity region 7 having a higher impurity concentration compared with the semiconductor substrate 1 is formed at a predetermined depth from the surface of the device formation region of the semiconductor substrate 1, for example, at a depth of several hundred nanometers.

Figure 41:
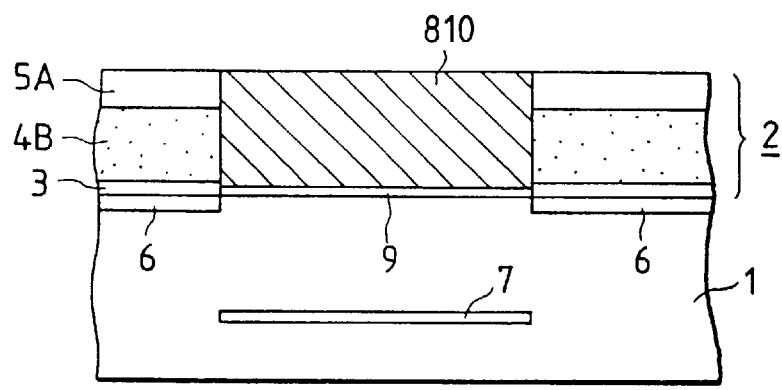
FIG. 41 is a cross-sectional view showing the principal elements of the semiconductor device arranged in sequential order of steps of a manufacturing method in the ninth embodiment of the present invention.
Figure 42:
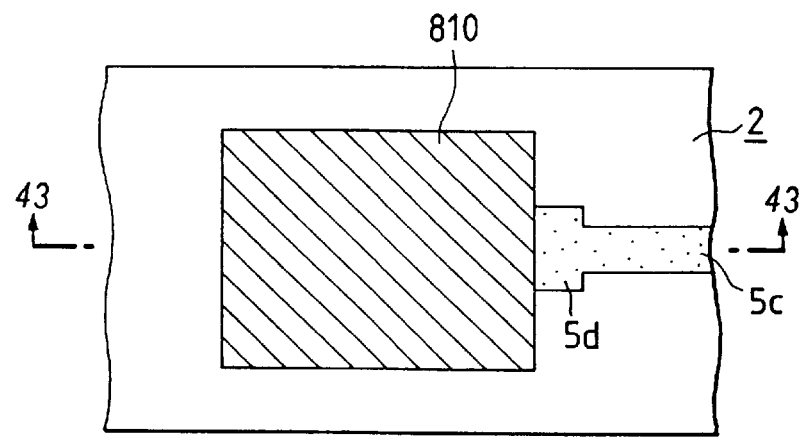
FIG. 42 is a plan view showing the principal elements of the semiconductor device arranged in sequential order of steps of a manufacturing method in the ninth embodiment of the present invention.
Figure 43:
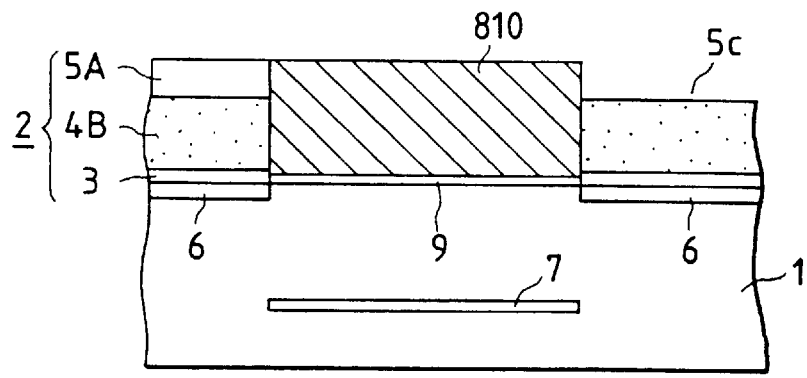
FIG. 43 is a cross-sectional view taken along line 43—43 shown in FIG. 42.

As shown in FIG. 41, similar to the eighth embodiment, that is, similar to the first embodiment described with reference to FIGS. 6 and 7, the buried polycrystalline silicon layer 810 is formed only in the opening 2a of the device isolation film 2. Thereafter, as shown in FIGS. 42 and 43, the surface of the third layer 5 of the device isolation film 2 is etched to such an extent that the surface of the second layer 5A is exposed at, the position where the gate electrode wiring layer 17 is to be formed, by a well known photolithography or etching technique using the second layer 4B as an etching stopper, whereby the gate electrode wiring groove 5c is formed. As is evident from the drawings, to ensure electrical connection between the gate electrode wiring layer and the end surface 8c of the gate electrode 8, the gate electrode wiring groove 5c has a wider portion 5d which is provided at the position where the gate electrode wiring layer is in contact with the end surface 8c of the gate electrode 8, allowing for alignment accuracy obtained when the gate electrode 8 is formed.

Figure 44:
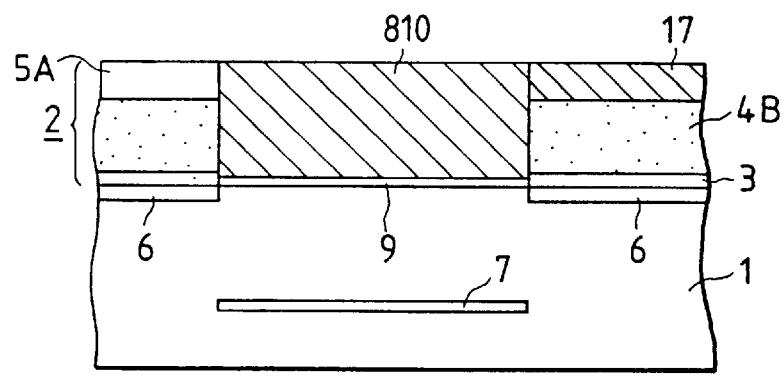
FIG. 44 is a cross-sectional view showing the principal elements of the semiconductor device arranged in sequential order of steps of a manufacturing method in the ninth embodiment of the present invention.

Then, as shown in FIG. 44, a polycrystalline silicon layer (which may be doped with impurities such as phosphorous or boron) is formed over the whole of one major surface of the semiconductor substrate 1, that is, over the surface of the device isolation film 2 and the upper surface of the buried polycrystalline silicon layer 810, by sputtering or CVD. The polycrystalline silicon layer, other than the layer remaining in the gate electrode wiring groove 5c, is removed by etchback or polishing. After the polycrystalline silicon layer for a gate electrode wiring layer electrically connected to the end surface of the polycrystalline silicon layer 810 has been formed, a resist layer will be formed using a well known photolithography or etching technique, while portions where the gate electrode and the gate electrode wiring layer are to be positioned are retained. The buried polycrystalline silicon layer 810 is etched by a well known etching technique using this resist layer as a mask, whereby the gate electrode 8 and the gate electrode wiring layer 17 are formed.

Subsequently, in the same manner as in the eight embodiment, that is, in the same manner as in the first embodiment previously described with reference to FIGS. 12 to 18, the semiconductor device is sequentially formed, as a result of which the semiconductor device shown in FIG. 38 is obtained. The thus obtained semiconductor device yields the same advantageous results as are obtained by the semiconductor device of the eighth embodiment. In addition, the gate electrode wiring layer 17 is electrically connected to the end surface 8c of the gate electrode 8, and hence the side wall insulation film 14 is inevitably interposed between the end surface of the gate electrode wiring layer 17 and the end surfaces of the pair of source/drain electrodes 15 and 16. Therefore, even if an alignment error arises when the gate electrode wiring groove 5c and the gate electrode 8 are formed, the gate electrode wiring layer 17 and the pair of source/drain electrodes 15 and 16 will not be electrically short-circuited.

In the ninth embodiment, polycrystalline silicon is used for the gate electrode wiring layer 17. However, the material of the gate electrode wiring layer 17 is not limited to this, and the gate electrode wiring layer 17 may be a conductive layer selected from the group comprising a metal silicide layer such as tungsten silicide, titanium silicide, cobalt silicide, tantalum silicide, molybdenum silicide, or platinum silicide; a metal nitride film layer such as titanium nitride, or tantalum nitride; a metal layer such as tungsten, tantalum, molybdenum, or cobalt; a metal layer such as aluminum; or a laminated body consisting of two or more of above.

Tenth Embodiment

Figure 45:
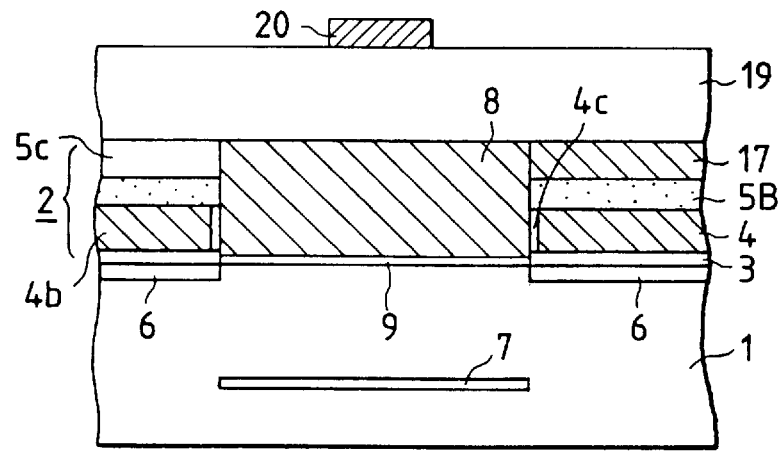
FIG. 45 is a cross-sectional view showing the principal elements of a semiconductor device in a tenth embodiment of the present invention.

FIG. 45 shows a semiconductor device in a tenth embodiment of the present invention. The tenth embodiment is different from the first embodiment only in that the third layer 5 of the device isolation film 2 has a two-layer structure, that is, the silicon nitride film 5B and the silicon oxide film 5C, and the gate electrode wiring groove 5c at which a part of the end surface 8c of the gate electrode 8 is exposed is formed in the third layer 5 of the device isolation film 2. The gate electrode wiring layer 17 is embedded in this gate electrode wiring groove 5c, and the gate electrode wiring layer 17 is electrically connected to an exposed portion of the end surface 8c of the gate electrode 8. The tenth embodiment is the same as the first embodiment in all other respects.

Figure 46:
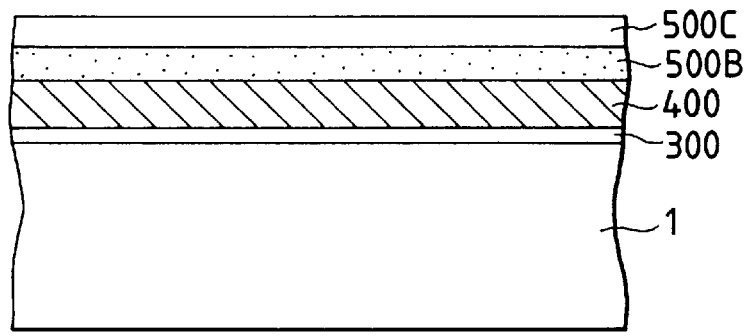
FIG. 46 is a cross-sectional view showing the principal elements of the semiconductor device arranged in sequential order of steps of a manufacturing method in the tenth embodiment of the present invention.

A method of manufacturing the semiconductor device of the tenth embodiment will now be described. As shown in FIG. 46, a silicon oxide film 300 having a thickness of, for example, 20 nm is first formed over one major surface of a semiconductor substrate 1 by thermal oxidation or CVD. Then, a polycrystalline silicon film 400 having a thickness of, for example, 100 nm is formed on the surface of the silicon oxide film 300 by CVD. Further, a silicon nitride film 500B having a thickness of, for example, 200 nm is formed on the surface of the polycrystalline silicon film 400 by CVD, and a silicon oxide film 500C having a thickness of, for example, 100 nm is formed on the silicon nitride film 500B by CVD.

Figure 47:
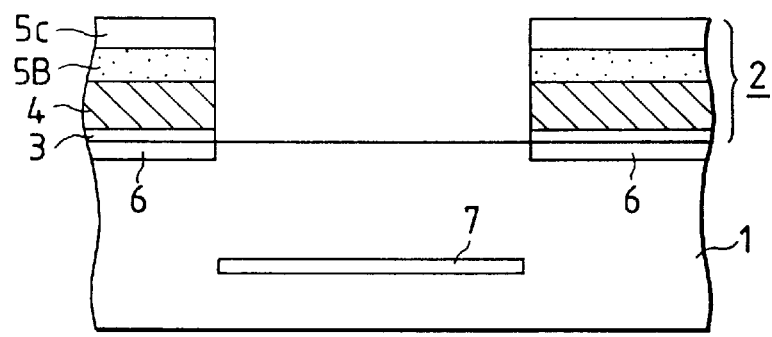
FIG. 47 is a cross-sectional view showing the principal elements of the semiconductor device arranged in sequential order of steps of a manufacturing method in the tenth embodiment of the present invention.

As shown in FIG. 47, a resist is formed on the surface of the silicon oxide film 500C, and the resist has an opening which is rectangular as viewed from above and is aligned with the device formation region. The silicon oxide film 500C is etched by etching gas consisting of, for example, a mixture of $CF_4$ and $H_2$ (the partial pressure of $H_2$ is adjusted so that the etch rate will increase with respect to the silicon oxide film) using the resist layer as a mask, and also using the silicon nitride film 500B as an etching stopper. Then, the silicon nitride film 500B is etched by etching gas consisting of, for example, a mixture of $CF_4$ and $H_2$ (the partial pressure of $H_2$ is adjusted so that the etch rate will increase with respect to the silicon nitride film) using the polycrystalline silicon film 400 as an etching stopper. The polycrystalline silicon film 400 is then etched by etching gas consisting of, for example, a mixture of $Cl_2$ or $SF_6$ using the silicon oxide film 300 as an etching stopper. Finally, the silicon oxide film 300 is etched by etching gas consisting of a mixture of, for example, $CF_4$ and $H_2$ (here, the partial pressure of $H_2$ is adjusted so that the etch rate can increase with respect to the silicon oxide film). As a result of this, the device isolation film 2 is formed which is made up of the first layer 3, the second layer 4B, and the third layers 5B and 5C, each having opening 2a aligned with the device formation region of the semiconductor substrate 1.

Allowing for evenness in etch rate, 10% overetching is usually carried out when the silicon oxide film 500C, the silicon nitride film 500B, the polycrystalline silicon film 400, and the silicon oxide film 300 are etched. In the tenth embodiment, similar to the first embodiment, a device (MOS transistor), whose characteristics are not so deteriorated, is formed in the device formation region.

Even in the tenth embodiment, as with the first embodiment, it is possible to remove the remaining silicon oxide film having a height of several nanometers resulting from the unevenness of the etch rate by a solution of diluted HF, without carrying out overetching. In this case, it is possible to form the opening 3a of the first layer 3 with even less damage.

Impurities having the same conductivity type as the semiconductor substrate 1, for example, p-type impurities such as boron, are implanted into the semiconductor substrate at an implant energy of several hundred keV at a dose of $10^{12}$–$10^{13}$ $cm^{-2}$. As a result of this, the first impurity region 6, having a higher impurity concentration compared with the semiconductor substrate 1 which acts as a channel stopper, is formed, in a self-aligned manner with respect to the device isolation film 2, on the surface of the device isolation region of the semiconductor substrate 1, that is, the surface directly below the device isolation film 2. Moreover, the second impurity region 7 having a higher impurity concentration compared with the semiconductor substrate 1 is formed at a predetermined depth from the surface of the device formation region of the semiconductor substrate 1, for example, at a depth of several hundred nanometers.

Figure 48:
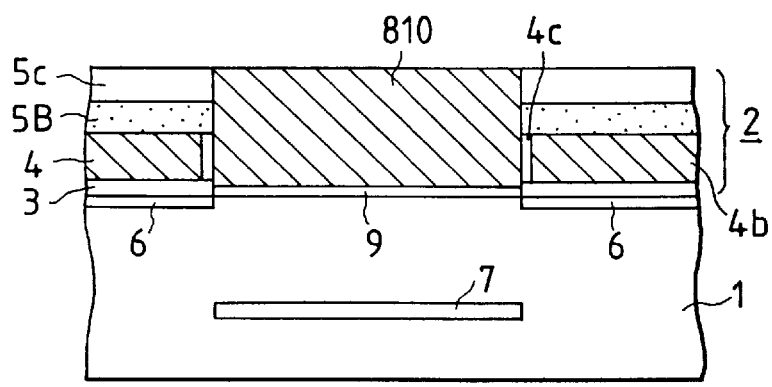
FIG. 48 is a cross-sectional view showing the principal elements of the semiconductor device arranged in sequential order of steps of a manufacturing method in the tenth embodiment of the present invention.
Figure 49:
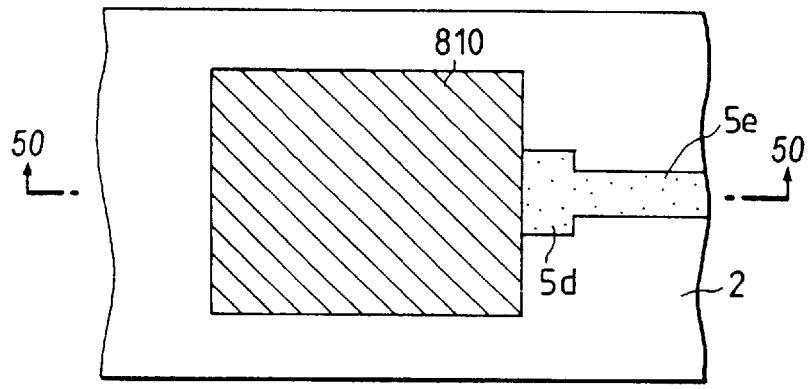
FIG. 49 is a plan view showing the principal elements of the semiconductor device arranged in sequential order of steps of a manufacturing method in the tenth embodiment of the present invention.
Figure 50:
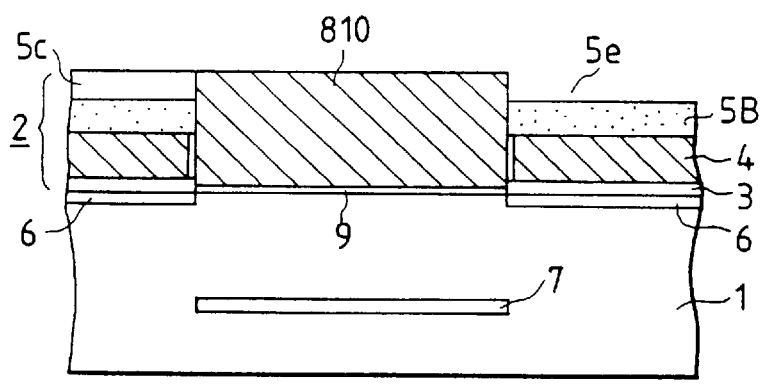
FIG. 50 is a cross-sectional view taken along line 50—50 shown in FIG. 49.

As shown in FIG. 48, similar to the first embodiment described with reference to FIGS. 6 and 7, the buried polycrystalline silicon layer 810 is formed only in the opening 2a of the device isolation film 2. Thereafter, as shown in FIGS. 49 and 50, the surface of the silicon oxide film 5C, which forms the upper layer of the device isolation film 2 positioned at the place where the gate electrode wiring layer 17 is to be formed, is etched to such an extent that the surface of the silicon nitride film 5B is exposed by a well known photolithography or etching technique using the silicon nitride film 5B, which forms a lower layer of the third layer, as an etching stopper, whereby the gate electrode wiring groove 5c is formed. As is evident from the drawings, to ensure electrical connection between the gate electrode wiring layer and the end surface 8c of the gate electrode 8, the gate electrode wiring groove 5e has a wider portion 5d which is provided at the position where the gate electrode wiring layer is in contact with the end surface 8c of the gate electrode 8, allowing for alignment accuracy obtained when the gate electrode 8 is formed.

Figure 51:
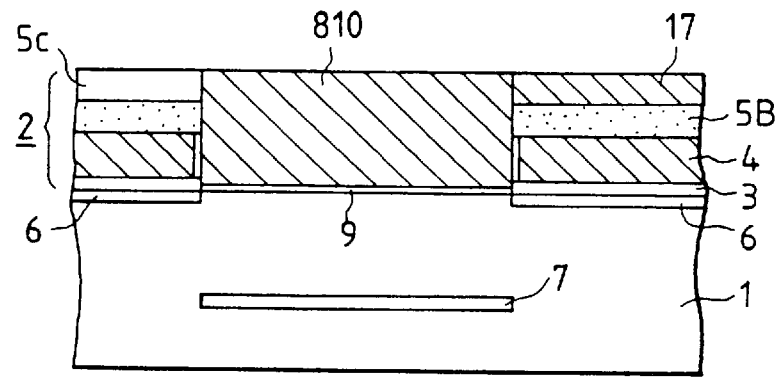
FIG. 51 is a cross-sectional view showing the principal elements of the semiconductor device arranged in sequential order of steps of a manufacturing method in the tenth embodiment of the present invention.

Then, as shown in FIG. 51, a polycrystalline silicon layer (which may be doped with impurities such as phosphorous or boron) is formed over the whole of one major surface of the semiconductor substrate 1, that is, over the surface of the device isolation film 2 and the upper surface of the buried polycrystalline silicon layer 810 by sputtering or CVD. The polycrystalline silicon layer, other than the layer remaining in the gate electrode wiring groove 5e, is removed by etchback or polishing. After the polycrystalline silicon layer for a gate electrode wiring layer electrically connected to the end surface of the polycrystalline silicon layer 810 has been formed, a resist layer will be formed using a well known photolithography or etching technique, while portions where the gate electrode and the gate electrode wiring layer are to be positioned are retained. The buried polycrystalline silicon layer 810 is etched by a well known etching technique using this resist layer as a mask, whereby the gate electrode 8 and the gate electrode wiring layer 17 are formed.

Subsequently, in the same manner as in the first embodiment previously described with reference to FIGS. 12 to 16, the semiconductor device is sequentially formed, as a result of which the semiconductor device shown in FIG. 45 is obtained. The thus obtained semiconductor device yields the same advantageous results as are provided by the semiconductor device in the first embodiment. In addition, the gate electrode wiring layer 17 is electrically connected to the end surface 8c of the gate electrode 8, and hence the side wall insulation film 14 is inevitably interposed between the end surface of the gate electrode wiring layer 17 and the end surfaces of the pair of source/drain electrodes 15 and 16. Therefore, even if an alignment error arises when the gate electrode wiring groove 5e and the gate electrode 8 are formed, the gate electrode wiring layer 17 and the pair of source/drain electrodes 15 and 16 will not be electrically short-circuited.

In the tenth embodiment, polycrystalline silicon is used for the gate electrode wiring layer 17. However, the material of the gate electrode wiring layer 17 is not limited to this, and the gate electrode wiring layer 17 may be a conductive layer selected from the group comprising a metal silicide layer such as tungsten silicide, titanium silicide, cobalt silicide, tantalum silicide, molybdenum silicide, or platinum silicide; a metal nitride film layer such as titanium nitride, or tantalum nitride; a metal layer such as tungsten, tantalum, molybdenum, or cobalt; a metal layer such as aluminum; or a laminated body consisting of two or more of above.

Eleventh Embodiment

Figure 52:
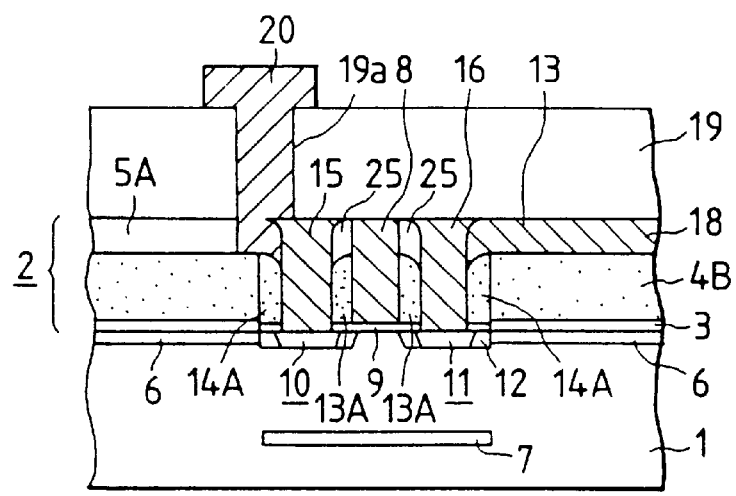
FIG. 52 is a cross-sectional view showing the principal elements of a semiconductor device in an eleventh embodiment of the present invention.

FIG. 52 shows a semiconductor device in an eleventh embodiment of the present invention. The eleventh embodiment is different from the eighth embodiment only in the following points: Namely, the side wall insulation films 13 and 14 are formed from a silicon nitride film; a groove 5e for a gate electrode wiring layer is formed in a third layer 5A of the device isolation film 2 so as to expose a part of the end surface 8c of the gate electrode 8; the gate electrode wiring layer 17 is embedded in this gate electrode wiring groove 5e; the gate electrode wiring layer 17 is electrically connected to an exposed portion of the end surface 8c of the gate electrode 8; a groove 5f for one source/drain electrode wiring layer is formed in the third layer 5A of the device isolation film 2 so as to expose a part of the side surface of one source/drain electrode 15; one source/drain electrode wiring layer 18 is embedded in this gate electrode wiring groove 5f; and the one source/drain electrode wiring layer 18 is electrically connected to an exposed portion of the side surface of one source/drain electrode 16. The eleventh embodiment is the same as the eighth embodiment in all other respects.

Figure 53:
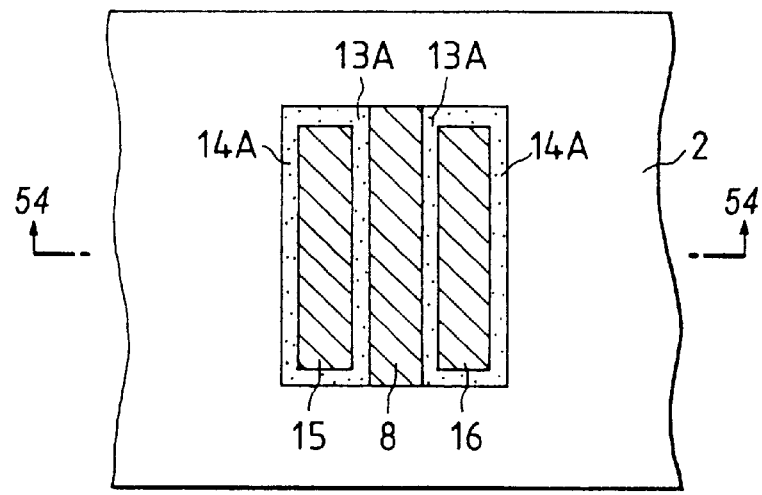
FIG. 53 is a plan view showing the principal elements of the semiconductor device arranged in sequential order of steps of a manufacturing method in the eleventh embodiment of the present invention.
Figure 54:
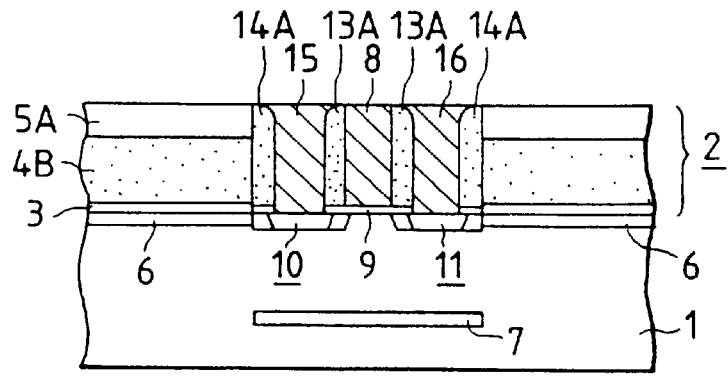
FIG. 54 is a cross-sectional view taken along line 54—54 shown in FIG. 53.

A method of manufacturing the semiconductor device of the eleventh embodiment will now be described. As shown in FIGS. 53 and 54, the semiconductor device is manufactured in the same manner as in the eighth embodiment until the n-type MOS transistor is obtained wherein the gate electrode 8, the pair of source/drain regions 10 and 11, and the pair of source/drain electrodes 15 and 16 are provided in the device formation region of the semiconductor substrate 1 which is surrounded by the device isolation film 2, that is, which is exposed at the opening 2a. In contrast to the use of a silicon oxide film for the side wall insulation films 13 and 14 in the eighth embodiment, a silicon nitride film is used in this embodiment. Except for this point, the eleventh embodiment is the same as the eighth embodiment in all other respects.

In the device isolation film 2, the thicknesses of the silicon oxide film 3, the silicon nitride film 4, and the silicon oxide film 5A are, for example, 20 nm, 300 nm, and 100 nm, respectively.

Figure 55:
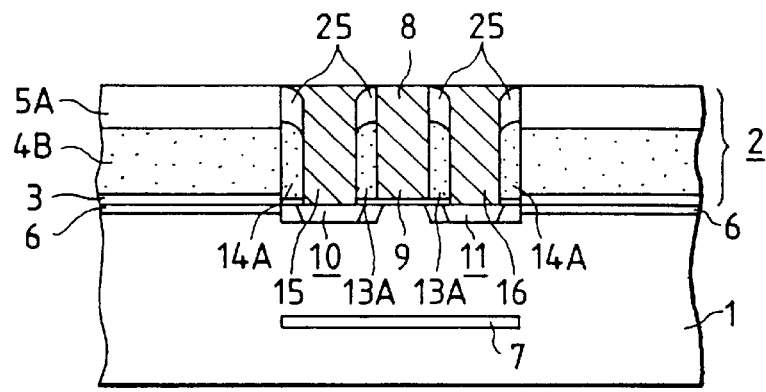
FIG. 55 is a cross-sectional view showing the principal elements of the semiconductor device arranged in sequential order of steps of a manufacturing method in the eleventh embodiment of the present invention.

Thereafter, as shown in FIG. 55, the side wall insulation films 13 and 14 consisting of a silicon nitride film are subjected to dry etching, whereby the thicknesses of the side wall insulation films 13 and 14 are reduced by, for example, 100 nm. A silicon oxide film, having a thickness of at least 50 nm, is formed over the whole of one major surface of the semiconductor substrate 1, that is, over the surface of the third layer 5A of the device isolation film 2, the upper surface of the gate electrode 8, the upper surfaces of the pair of source/drain electrodes 15 and 16, and the upper surfaces of the side wall insulation films 13 and 14 (which include a space removed as a result of etching) by CVD. The thus-formed silicon oxide film is etched back until the top surfaces of the gate electrode 8 and the source/drain electrodes 15 and 16 are exposed. Thus, the spaces produced by removing the side wall insulation films 13 and 14 by etching is filled with silicon oxide films 25.

Figure 56:
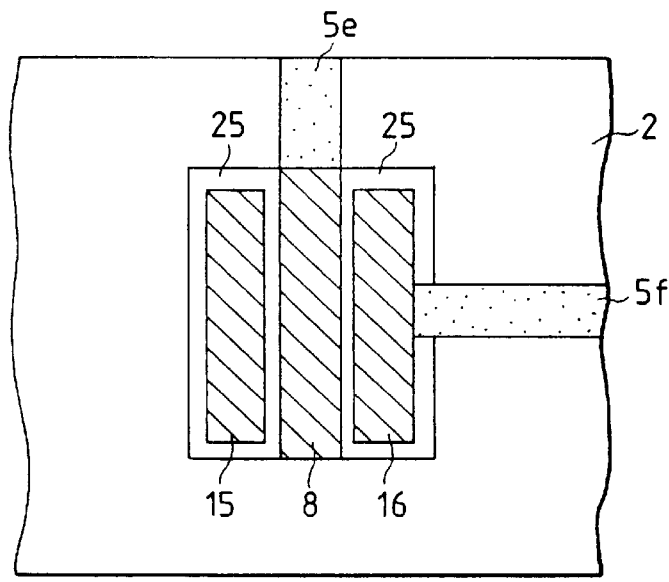
FIG. 56 is a plan view showing the principal elements of the semiconductor device arranged in sequential order of steps of a manufacturing method in the eleventh embodiment of the present invention.

Then, as shown in FIG. 56, a gate electrode wiring groove 5e and one source/drain electrode wiring groove 5f are formed by etching the portions of the surface of the third layer 5A of the device isolation film 2 where a gate electrode wiring layer 17 and one source/drain electrode wiring layer 18 are to be formed, by a generally known photolithographic technique and etching technique until the surface of the second layer 4B is exposed by using the second layer 4B and the side wall isolation films 13 and 14 as an etching stopper.

Figure 57:
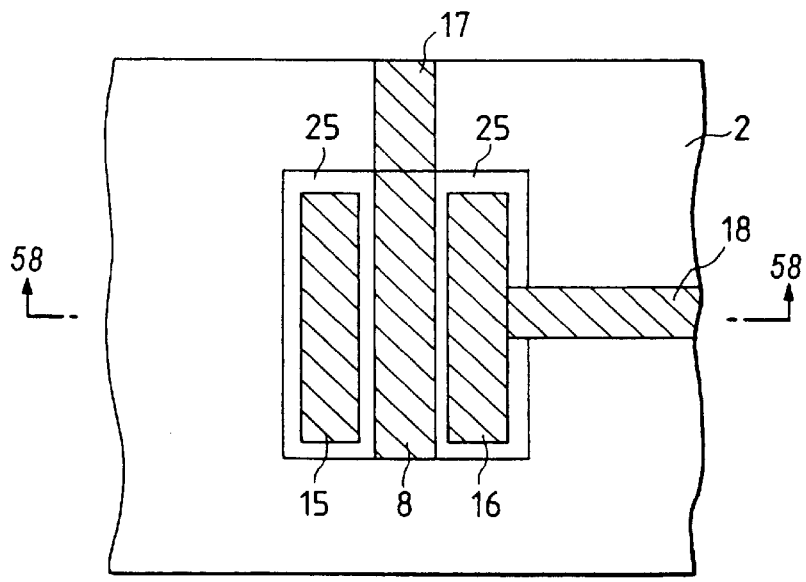
FIG. 57 is a plan view showing the principal elements of the semiconductor device arranged in sequential order of steps of a manufacturing method in the eleventh embodiment of the present invention.
Figure 58:
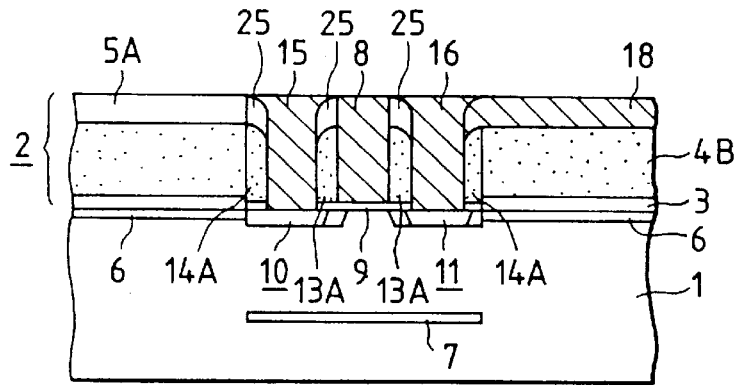
FIG. 58 is a cross-sectional view taken along line 58—58 shown in FIG. 57.

Then, as shown in FIGS. 57 and 58, a polycrystalline silicon layer (which may be doped with impurities such as phosphorous or boron) is formed over the whole of one major surface of the semiconductor substrate 1, that is, over the surface of the device isolation film 2, the upper surface of the gate electrode 8, and the upper surfaces of the pair of source/drain electrodes 15 and 16 by sputtering or CVD. The polycrystalline silicon layer, other than the layer remaining in the gate electrode wiring groove 5e and the one source/drain electrode wiring groove 5f, is removed by etchback or polishing. As a result of this, the gate electrode wiring layer 17 and the one source/drain electrode wiring layer 18 are formed.

Subsequently, the interlayer insulation film 19 consisting of a silicon oxide film is formed on the surfaces of the third layer 5A of the device isolation film 2, the gate electrode wiring layer 17, and the one source/drain electrode wiring layer 18 by means of CVD. Thereafter, the contact hole 19a is formed in the upper surface of the other source/drain electrode 15 using the second layer 4B and the side wall insulation film 14 as an etching stopper. A conductive layer, such as aluminum or aluminum alloy, having a thickness of, for example, 500 nm is formed over the whole of the surface of the interlayer insulation film 19 by sputtering or CVD. A resist layer is patterned over the conductive layer. The conductive layer is then etched using this resist layer as a mask, as a result of which the other source/drain electrode wiring layer 20 is formed so as to be electrically connected to the source/drain electrode 15 via the contact hole 19a of the interlayer insulation film 19. In this way, a semiconductor device such as shown in FIG. 52 is obtained. The thus obtained semiconductor device yields the same advantageous results as are provided by the semiconductor device in the eighth embodiment.

In the eleventh embodiment, polycrystalline silicon is used for the gate electrode wiring layer 17 and the one source/drain electrode wiring layer 18. However, the material of them is not limited to the polycrystalline silicon, and the gate electrode wiring layer 17 and the source/drain electrode wiring layer 18 may be a conductive layer selected from the group comprising a metal silicide layer such as tungsten silicide, titanium silicide, cobalt silicide, tantalum silicide, molybdenum silicide, or platinum silicide; a metal nitride film layer such as titanium nitride, or tantalum nitride; a metal layer such as tungsten, tantalum, molybdenum, or cobalt; a metal layer such as aluminum; or a laminated body consisting of two or more of above.

In the eleventh embodiment, the space removed as a result of the etching of the side wall insulation films 13 and 14 is filled with the silicon oxide film 25. However, the manufacturing step may proceed to the subsequent step of formation of the interlayer insulation film 19 without the formation of the silicon oxide film 25.

Twelfth Embodiment

Figure 59:
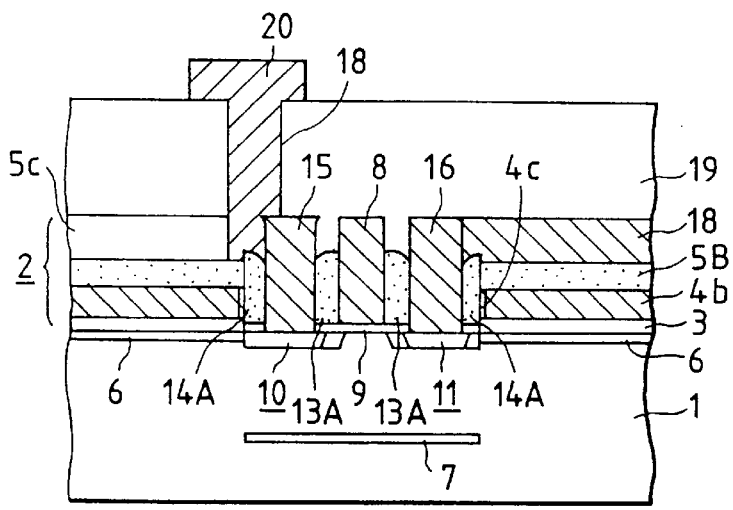
FIG. 59 is a cross-sectional view showing the principal elements of a semiconductor device in a twelfth embodiment of the present invention.

FIG. 59 shows a semiconductor device in a twelfth embodiment of the present invention. The twelfth embodiment is different from the first embodiment only in the following points: Namely, the third layer 5 of the device isolation film 2 has a two-layer structure consisting of a silicon nitride film 5B and a silicon oxide film 5C; the side wall insulation films 13 and 14 are formed from a silicon nitride film; a groove 5e for a gate electrode wiring layer is formed in the silicon oxide film 5C of the third layer 5 of the device isolation film 2 so as to expose a part of the end surface 8c of the gate electrode 8; the gate electrode wiring layer 17 is embedded in this gate electrode wiring groove 5e; the gate electrode wiring layer 17 is electrically connected to an exposed portion of the end surface 8c of the gate electrode 8; a groove 5f for a source/drain electrode wiring layer is formed in the silicon oxide film 5C of the third layer 5 of the device isolation film 2 so as to expose a part of the side surface of one source/drain electrode 16; one source/drain electrode wiring layer 18 is embedded in this gate electrode wiring groove 5f; and the one source/drain electrode wiring layer 18 is electrically connected to an exposed portion of the side surface of one source/drain electrode 16. The twelfth embodiment is the same as the first embodiment in all other respects.

Figure 60:
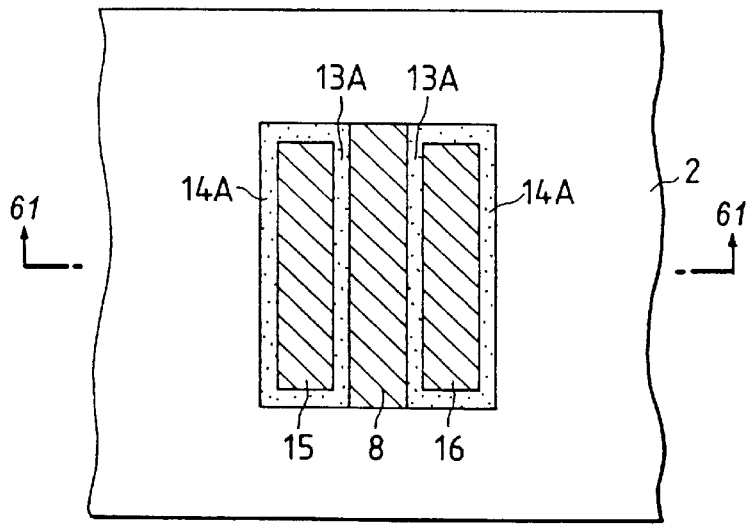
FIG. 60 is a plan view showing the principal elements of the semiconductor device arranged in sequential order of steps of a manufacturing method in the twelfth embodiment of the present invention.
Figure 61:
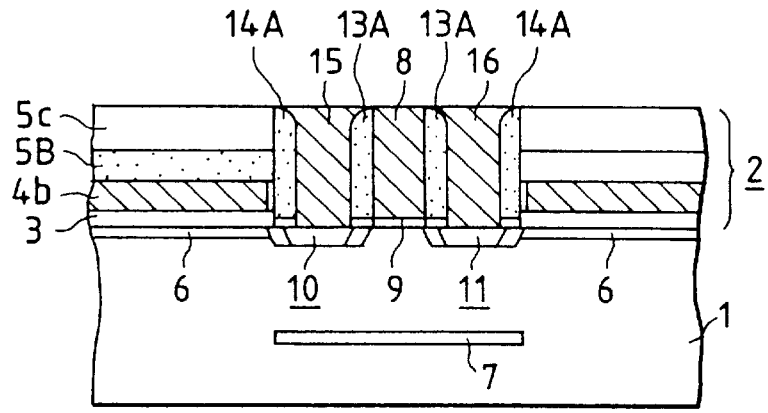
FIG. 61 is a cross-sectional view taken along line 61—61 shown in FIG. 60.

A method of manufacturing the semiconductor device of the twelfth embodiment will now be described. As shown in FIGS. 60 and 61, the semiconductor device is manufactured in the same manner as in the first embodiment until the n-type MOS transistor is obtained wherein the gate electrode 8, the pair of source/drain regions 10 and 11, and the pair of source/drain electrodes 15 and 16 are provided in the device formation region of the semiconductor substrate 1 which is surrounded by the device isolation film 2, that is, which is exposed at the opening 2a. In contrast to the third layer 5 of the device isolation film 2 which consists of a one-layer structure of a silicon oxide film in the first embodiment, the third layer 5 has a two-layer structure consisting of the silicon nitride film 5B and the silicon oxide film 5C in this embodiment. Further, in contrast to the use of a silicon oxide film for the side wall insulation films 13 and 14 in the first embodiment, a silicon nitride film is used in the twelfth embodiment. Except for these points, the twelfth embodiment is the same as the first embodiment in all other respects.

In the device isolation film 2, the thicknesses of the silicon oxide film 3, the polycrystalline silicon film 4, the silicon nitride film 5B, and the silicon oxide film 5C are, for example, 20 nm, 100 nm, 200 nm, and 100 nm, respectively.

Thereafter, the side wall insulation films 13 and 14 consisting of a silicon nitride film are subjected to dry etching, whereby the thicknesses of the side wall insulation films 13 and 14 are reduced by, for example, 100 nm. A silicon oxide film, having a thickness of at least more than 50 nm, is formed over the whole of one major surface of the semiconductor substrate 1, that is, over the surface of the silicon oxide film 5C of the third layer of the device isolation film 2, the upper surface of the gate electrode 8, the upper surfaces of the pair of source/drain electrodes 15 and 16, and the upper surfaces of the side wall insulation films 13 and 14 (which include a space removed as a result of etching) by CVD. The silicon oxide film is etched back until the upper surface of the gate electrode 8 and the upper surfaces of the pair of source/drain electrodes 15 and 16 are exposed. A space produced as a result of the etching of the side wall insulation films 13 and 14 is filled with the silicon oxide film 25.

Figure 62:
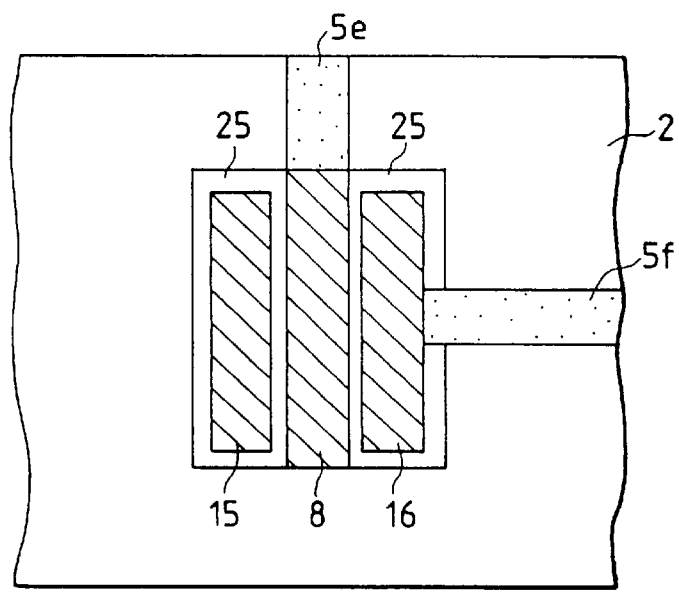
FIG. 62 is a plan view showing the principal elements of the semiconductor device arranged in sequential order of steps of a manufacturing method in the twelfth embodiment of the present invention.

As shown in FIG. 62, the surface of the silicon oxide film 5C of the third layer of the device isolation film 2 is etched by a well known photolithograpy or etching technique using the silicon nitride film 5B of the third layer and the side wall insulation films 13 and 14 as an etching stopper to such an extent that the surface of the silicon nitride film 5B is exposed at positions where the gate electrode wiring layer 17 and the one source/drain electrode wiring layer 18 are formed. As a result of this, the gate electrode wiring groove 5e and the one source/drain electrode wiring groove 5f are formed.

Figure 63:
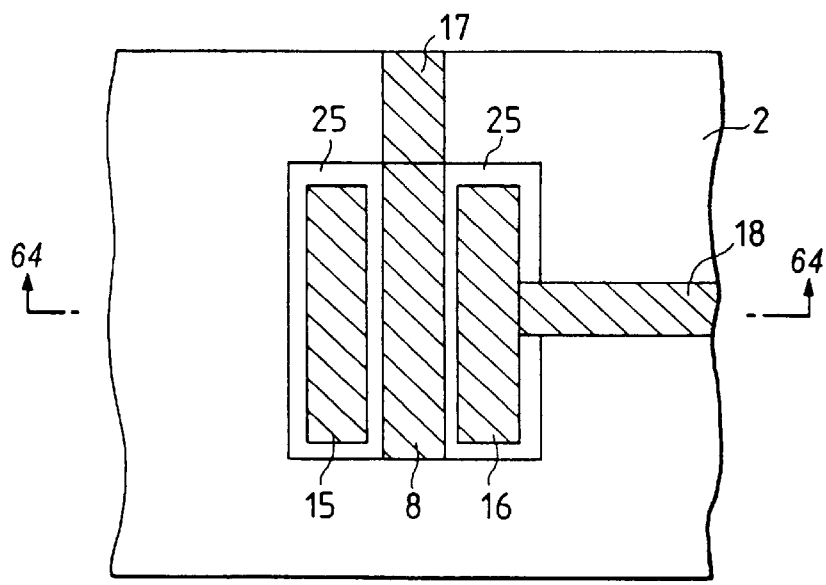
FIG. 63 is a plan view showing the principal elements of the semiconductor device arranged in sequential order of steps of a manufacturing method in the twelfth embodiment of the present invention.
Figure 64:
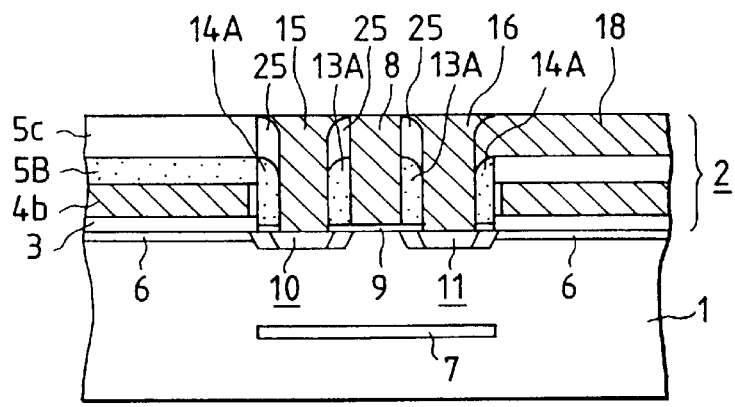
FIG. 64 is a cross-sectional view taken along line 64—64 shown in FIG. 63.

Then, as shown in FIGS. 63 and 64, a polycrystalline silicon layer (which may be doped with impurities such as phosphorous or boron) is formed over the whole of one major surface of the semiconductor substrate 1, that is, over the surface of the device isolation film 2, the upper surface of the gate electrode 8, and the upper surfaces of the pair of source/drain electrodes 15 and 16 by sputtering or CVD. The polycrystalline silicon layer, other than the layer remaining in the gate electrode wiring groove 5e and the one source/drain electrode wiring groove 5f, is removed by etchback or polishing. As a result of this, the gate electrode wiring layer 17 and the one source/drain electrode wiring layer 18 are formed.

Subsequently, the interlayer insulation film 19 consisting of a silicon oxide film is formed on the surfaces of the silicon oxide film 5C of the third layer of the device isolation film 2, the gate electrode wiring layer 17, and the one source/drain electrode wiring layer 18 by means of CVD. Thereafter, the contact hole 19a is formed in the upper surface of the other source/drain electrode 15 using the silicon nitride film 5B of the third layer and the side wall insulation film 14 as an etching stopper. A conductive layer, such as aluminum or aluminum alloy, having a thickness of, for example, 500 nm is formed over the whole of the surface of the interlayer insulation film 19 by sputtering or CVD. A resist layer is patterned over the conductive layer. The conductive layer is then etched using this resist layer as a mask, as a result of which the other source/drain electrode wiring layer 20 is formed so as to be electrically connected to the source/drain electrode 15 via the contact hole 19a of the interlayer insulation film 19. In this way, a semiconductor device such as shown in FIG. 59 is obtained. The thus obtained semiconductor device yields the same advantageous results as are provided by the semiconductor device in the first embodiment.

In the twelfth embodiment, polycrystalline silicon is used for the gate electrode wiring layer 17 and the one source/drain electrode wiring layer 18. However, the material of them is not limited to the polycrystalline silicon, and the gate electrode wiring layer 17 and the source/drain electrode wiring layer 18 may be a conductive layer selected from the group comprising a metal silicide layer such as tungsten silicide, titanium silicide, cobalt silicide, tantalum silicide, molybdenum silicide, or platinum silicide; a metal nitride film layer such as titanium nitride, or tantalum nitride; a metal layer such as tungsten, tantalum, molybdenum, or cobalt; a metal layer such as aluminum, or copper; or a laminated body consisting of two or more of above.

In the twelfth embodiment, the space removed as a result of the etching of the side wall insulation films 13 and 14 is filled with the silicon oxide film 25. However, the manufacturing step may proceed to the subsequent step of formation of the interlayer insulation film 19 without the formation of the silicon oxide film 25.

What is claimed is:

1. A semiconductor device comprising:

a semiconductor substrate having, on a major surface thereof, a device formation region;

a device isolation film comprising:
   a first layer made of an insulating material and formed on the major surface of the semiconductor subtrate so as to have an opening that surrounds the device formation region;
   a second layer made of a material different than that of the first layer, and formed on the first layer so as to have an opening that surrounds the device formation region; and
   a third layer made of a material that is insulative and different from that of the second layer, and formed on the second layer so as to have an opening that surrounds the device formation region; and a MIS transistor in the device formation region, comprising source and drain regions formed so as to be spaced from each other with a channel region interposed in between, and having PN junction ends that are in contact with the first layer of the device isolation film, wherein the MIS transistor comprises:
   a gate electrode formed on the channel region through a gate oxide film; and
   source and drain electrodes formed within the openings of the device isolation film, and electrically connected to the source and drain regions, respectively, while being electrically insulated from the gate electrode, and wherein the second layer of the device isolation film is made of a conductive material, and side surfaces of the second layer facing the device formation region are covered with an oxide film.

2. The semiconductor device according to claim 1, wherein the first and third layers of the device isolation film are silicon dioxide films, the second layer comprises a polycrystalline silicon film and a silicon dioxide film is formed on the side surfaces of the polycrystalline silicon film facing the device formation region, and the first layer is thinner than the third layer.

3. The semiconductor device according to claim 1, wherein the first layer of the device isolation film is a silicon dioxide film; the second layer comprises a polycrystalline silicon film and a silicon dioxide film is formed on the side surfaces of the polycrystalline silicon film facing the device formation region, the third layer is a silicon nitride film, and the first layer is thinner than the third layer.

4. The semiconductor device according to claim 2, wherein the first layer of the device isolation film is a silicon dioxide film, the second layer comprises a polycrystalline silicon film and a silicon dioxide film is formed on the side surfaces of the polycrystalline silicon film facing the device formation region, the third layer comprises a silicon nitride film and a silicon dioxide film formed thereon, and the first layer is thinner than the third layer.

5. A semiconductor device comprising:
a semiconductor substrate having, on a major surface thereof, a device formation region;
a device isolation film comprising:
   a first layer made of an insulating material and formed on the major surface of the semiconductor substrate;
   a second layer made of a material different than that of the first layer, and formed on the first layer; and
   a third layer made of a material that is insulative and different from that of the second layer, and formed on the second layer, each of the first, second, and third layers having an opening formed therein which surrounds the entire device formation region; and
   a MIS transistor in the device formation region, comprising source and drain regions formed so as to be spaced from each other with a channel region interposed in between, and having PN junction ends that are in contact with the first layer of the device isolation film, wherein the MIS transistor comprises:
      a gate electrode formed on the channel region through a gate oxide film; and
      source and drain electrodes formed within the openings of the device isolation film, and electrically connected to the source and drain regions, respectively, while being electrically insulated from the gate electrode, and wherein the first and third layers of the device isolation film are silicon dioxide films, the second layer is a silicon nitride film, and the first layer is thinner than the third layer.

6. A semiconductor device comprising:
a semiconductor substrate having, on a major surface thereof, a device formation region;
a device isolation film comprising:
   a first layer made of an insulating material and formed on the major surface of the semiconductor substrate so as to have an opening that surrounds the device formation region;
   a second layer made of a material different than that of the first layer, and formed on the first layer so as to have an opening that surrounds the device formation region; and
   a third layer made of a material that is insulative and different from that of the second layer, and formed on the second layer so as to have an opening that surrounds the device formation region; and
   a MIS transistor in the device formation region, comprising source and drain regions formed so as to be spaced from each other with a channel region interposed in between, and having PN function ends that are in contact with the first layer of the device isolation film, wherein the MIS transistor comprises:
      a gate electrode formed on the channel region through a gate oxide film; and
      source and drain electrodes formed within the openings of the device isolation film, and electrically connected to the source and drain regions, respectively, while being electrically insulated from the gate electrode, wherein opposite end surfaces of the gate electrode are in contact with respective opposed side surfaces of the opening of the device isolation film, and opposite side surfaces of the gate electrode are electrically insulated from respective side surfaces of the source and drain electrodes by respective sidewall insulation films that are in contact with the opposite side surfaces of the gate electrode, wherein the side-wall insulation films are silicon nitride films.

7. A semiconductor device comprising:
a semiconductor substrate having, on a major surface thereof, a device formation region;
a device isolation film comprising:
   a first layer made of an insulating material and formed on the major surface of the semiconductor substrate so as to have an opening that surrounds the device formation region;
   a second layer made of a material different than that of the first layer, and formed on the first layer so as to have an opening that surrounds the device formation region; and
   a third layer made of a material that is insulative and different from that of the second layer, and formed on the second layer so as to have an opening that surrounds the device formation region; and
a MIS transistor in the device formation region, comprising source and drain regions formed so as to be spaced from each other with a channel region interposed in between, and having PN junction ends that are in contact with the first layer of the device isolation film, wherein the MIS transistor comprises:
   a gate electrode formed on the channel region through a gate oxide film; and
   source and drain electrodes formed within the openings of the device isolation film, and electrically connected to the source and drain regions, respectively, while being electrically insulated from the gate electrode, wherein opposite end surfaces of the gate electrode are in contact with respective opposed side surfaces of the opening of the device isolation film, and opposite side surfaces of the gate electrode are electrically insulated from respective side surfaces of the source and drain electrodes by respective sidewall insulation films that are in contact with the opposite side surfaces of the gate electrode, wherein each of the sidewall insulation films is a two-layer member consisting of a silicon dioxide film and a silicon nitride film.

8. A semiconductor device comprising:
a semiconductor substrate having, on a major surface thereof, a device formation region;
a device isolation film comprising:
   a first layer made of an insulating material and formed on the major surface of the semiconductor substrate;
   a second layer made of a material different than that of the first layer, and formed on the first layer; and
   a third layer made of a material that is insulative and different from that of the second layer, and formed on the second layer, each of the first, second and third layers having an opening formed therein which surrounds the entire device formation region;
   a MIS transistor in the device formation region, comprising source and drain regions formed so as to be spaced from each other with a channel region interposed in between, and having PN junction ends that are in contact with the first layer of the device isolation film.

9. The semiconductor device according to claim 8, wherein the MIS transistor comprises:
   a gate electrode formed on the channel region through a gate oxide film; and
   source and drain electrodes formed within the openings of the device isolation film, and electrically connected to the source and drain regions, respectively, while being electrically insulated from the gate electrode.

10. The semiconductor device according to claim 9, wherein opposite end surfaces of the gate electrode are in contact with respective opposed side surfaces of the openings of the device isolation film, and opposite side surfaces of the gate electrode are electrically insulated from respective side surfaces of the source and drain electrodes by respective sidewall insulation films that are in contact with the opposite side surfaces of the gate electrode.

11. The semiconductor device according to claim 10, wherein the side-wall insulation films are silicon dioxide films.

12. The semiconductor device according to claim 9, wherein top surfaces of the gate electrode and the source and drain electrodes are substantially flush with a top surface of the third layer of the device isolation film.

13. The semiconductor device according to claim 9, further comprising a gate electrode wiring layer that is embedded in a wiring groove formed in a top surface of the third layer of the device isolation film so as to expose a portion of an end surface of the gate electrode, and is connected to the exposed portion of the end surface of the gate electrode.

14. The semiconductor device according to claim 13, wherein the gate electrode and the gate electrode wiring layer are made of different materials.

15. The semiconductor device according to claim 9, further comprising a source/drain electrode wiring layer that is embedded in a wiring groove formed in a top surface of the third layer of the device isolation film so as to expose a portion of a side surface of one of the source and drain electrodes, and is connected to the exposed portion of the side surface of the one of the source and drain electrodes.

16. The semiconductor device according to claim 9, further comprising:
   an interlayer insulation film formed on the device isolation film, the gate electrode, and the source and drain electrodes, and having a contact hole formed at a position corresponding to one of the source and drain electrodes; and
   a source/drain electrode wiring layer formed on the interlayer insulation film, and electrically connected to the one of the source and drain electrodes through the contact hole.

* * * * *